US011232029B2

(12) United States Patent
Sohn et al.

(10) Patent No.: US 11,232,029 B2
(45) Date of Patent: Jan. 25, 2022

(54) STACKED MEMORY DEVICE AND OPERATING METHOD THEREOF

(71) Applicant: Samsung Electronics Co., Ltd., Suwon-si (KR)

(72) Inventors: Joonsik Sohn, Yongin-si (KR); Hyunjoong Kim, Yongin-si (KR); Woongjae Song, Seoul (KR); Soowoong Ahn, Seoul (KR); Seunghyun Cho, Suwon-si (KR); Jihyun Choi, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/003,346

(22) Filed: Aug. 26, 2020

(65) Prior Publication Data

US 2021/0240615 A1    Aug. 5, 2021

(30) Foreign Application Priority Data

Feb. 3, 2020    (KR) .......................... 10-2020-0012629

(51) Int. Cl.
| | | |
|---|---|---|
| *G11C 8/00* | (2006.01) | |
| *G06F 12/06* | (2006.01) | |
| *H01L 23/48* | (2006.01) | |
| *H01L 25/065* | (2006.01) | |

(52) U.S. Cl.
CPC ................ *G06F 12/06* (2013.01); *G11C 8/00* (2013.01); *H01L 23/481* (2013.01); *H01L 25/0657* (2013.01)

(58) Field of Classification Search
CPC .......................... H01L 23/481; H01L 25/0657

USPC ........................................ 365/230.03, 230.06
See application file for complete search history.

(56) References Cited

U.S. PATENT DOCUMENTS

| | | | |
|---|---|---|---|
| 6,349,050 B1 | 2/2002 | Woo et al. | |
| 7,215,561 B2 | 5/2007 | Park et al. | |
| 8,314,483 B2 | 11/2012 | Lin et al. | |
| 8,930,647 B1 * | 1/2015 | Smith ................... | G06F 30/392 |
| | | | 711/154 |
| 8,972,822 B2 | 3/2015 | Nakano et al. | |
| 9,183,891 B2 | 11/2015 | Stephens, Jr. | |
| 9,348,380 B2 | 5/2016 | Ping et al. | |
| 9,997,233 B1 * | 6/2018 | Ware ................... | G06F 13/1673 |
| 10,445,229 B1 * | 10/2019 | Kuzmin ................ | G06F 3/0659 |
| 10,734,064 B1 * | 8/2020 | Ware ................... | G11C 11/4072 |
| 10,770,430 B1 * | 9/2020 | Kim ........................ | H01L 25/18 |
| 2009/0043932 A1 * | 2/2009 | Bernardi ................. | G11C 8/12 |
| | | | 710/110 |

(Continued)

FOREIGN PATENT DOCUMENTS

KR    10-2009-0106221 A    10/2009

*Primary Examiner* — Michael T Tran
(74) *Attorney, Agent, or Firm* — Harness, Dickey & Pierce, P.L.C.

(57) ABSTRACT

According to some example embodiments of the inventive concepts, there is provided a method of operating a stacked memory device including a plurality of memory dies stacked in a vertical direction, the method including receiving a command and an address from a memory controller, determining a stack ID indicating a subset of the plurality of memory dies by decoding the address, and accessing at least two memory dies among the subset of memory dies corresponding to the stack ID such that the at least two memory dies are non-adjacent.

19 Claims, 16 Drawing Sheets

(56) References Cited

U.S. PATENT DOCUMENTS

| | | | | |
|---|---|---|---|---|
| 2011/0298011 | A1* | 12/2011 | Lee | H01L 27/108 |
| | | | | 257/204 |
| 2014/0241071 | A1* | 8/2014 | Goss | G11C 7/20 |
| | | | | 365/189.05 |
| 2015/0092509 | A1 | 4/2015 | Kim | |
| 2018/0082737 | A1* | 3/2018 | Lee | G11C 11/40618 |
| 2018/0366429 | A1* | 12/2018 | Chiu | H01L 24/16 |
| 2019/0012099 | A1* | 1/2019 | Mulani | G06F 3/0619 |
| 2019/0196742 | A1* | 6/2019 | Yudanov | G06F 3/0659 |
| 2019/0303292 | A1* | 10/2019 | Byun | G06F 12/0607 |
| 2020/0004557 | A1* | 1/2020 | Nam | G06F 9/4401 |
| 2020/0167273 | A1* | 5/2020 | Byun | G06F 12/0246 |
| 2020/0192768 | A1* | 6/2020 | Byun | G06F 11/1469 |
| 2020/0211636 | A1* | 7/2020 | Hiscock | G11C 11/40622 |
| 2020/0219582 | A1* | 7/2020 | Kim | G11C 5/06 |
| 2020/0227130 | A1* | 7/2020 | Kim | G11C 11/4093 |
| 2020/0243422 | A1* | 7/2020 | Kim | H01L 23/3107 |
| 2020/0279793 | A1* | 9/2020 | Xie | H01L 25/0652 |
| 2020/0371869 | A1* | 11/2020 | Park | G06F 11/1076 |
| 2020/0381316 | A1* | 12/2020 | Lee | H01L 25/18 |
| 2021/0034301 | A1* | 2/2021 | Zhou | G06F 12/0246 |
| 2021/0055867 | A1* | 2/2021 | He | G06F 3/0673 |
| 2021/0097209 | A1* | 4/2021 | Kondo | G06F 12/1408 |
| 2021/0118770 | A1* | 4/2021 | Kuo | H01L 23/3732 |
| 2021/0118853 | A1* | 4/2021 | Harris | G06F 13/4027 |
| 2021/0191850 | A1* | 6/2021 | Subbarao | G06F 12/0882 |

* cited by examiner

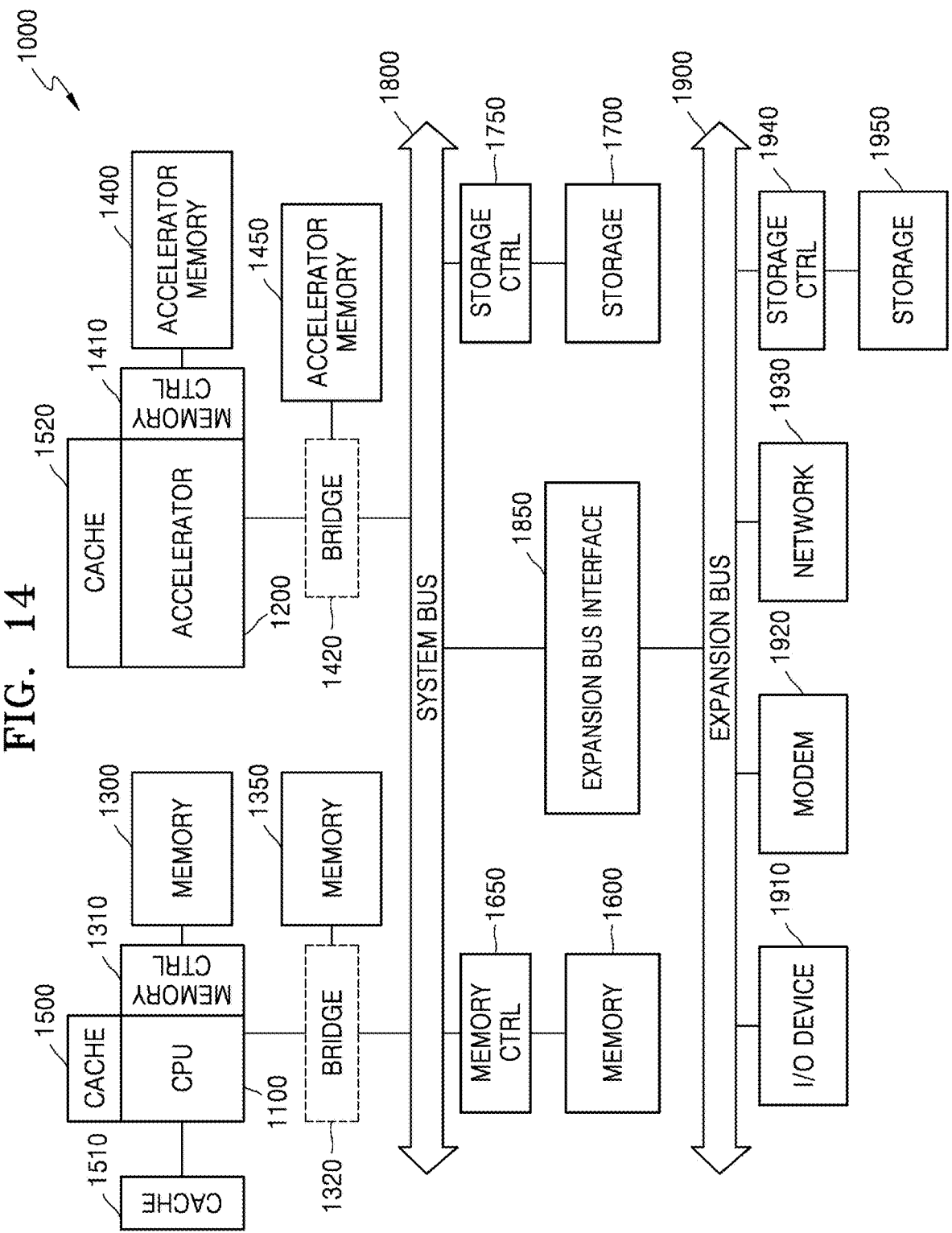

STACKED MEMORY DEVICE AND OPERATING METHOD THEREOF

CROSS-REFERENCE TO RELATED APPLICATION

This application claims the benefit of Korean Patent Application No. 10-2020-0012629, filed on Feb. 3, 2020, in the Korean Intellectual Property Office, the disclosure of which is incorporated herein in its entirety by reference.

BACKGROUND

The inventive concepts relate to a memory device, and more particularly, to a stacked memory device and a method of operating the stacked memory device.

Semiconductor memory devices widely used in high-performance electronic systems are increasing in capacity and speed. An example of a memory device is dynamic random access memory (DRAM), which is a volatile memory, and is a memory that determines data by a charge stored in a capacitor. Recently, a stacked memory device in which a plurality of DRAM chips or dies are stacked has been developed to increase the capacity and speed of the DRAM. The performance of the stacked memory device may be deteriorated due to driving of adjacent DRAM chips or dies.

SUMMARY

According to some example embodiments of the inventive concepts, there is provided a method of operating a stacked memory device including a plurality of memory dies stacked in a vertical direction, the method including receiving a command and an address from a memory controller, determining a stack ID indicating a subset of the plurality of memory dies by decoding the address, and accessing at least two memory dies among the subset of memory dies corresponding to the stack ID such that the at least two memory dies are non-adjacent.

According to some example embodiments of the inventive concepts, there is provided a method of operating a stacked memory device including a plurality of memory chips stacked in a vertical direction, the method including receiving a command and an address from a memory controller, determining chip IDs each indicating one memory chip among the plurality of memory chips by decoding the address, and sequentially accessing at least two memory chips among the plurality of memory chips based on the chip IDs such that the at least two memory chips are non-adjacent.

According to some example embodiments of the inventive concepts, there is provided a stacked memory device including a plurality of memory dies stacked in a vertical direction, wherein the plurality of memory dies include a first memory die, a third memory die electrically connected to the first memory die via first TSVs, and a second memory die between the first memory die and the third memory die, wherein the second memory die is not connected to the first TSVs.

According to some example embodiments of the inventive concepts, there is provided a memory system including a memory device on an interposer and including a plurality of memory dies stacked in a vertical direction, and a memory controller adjacent to the memory device on the interposer configured to generating a stack ID indicating a subset of the plurality of memory dies, and transmit the generated stack ID to the memory device includes control logic circuitry configured to cause the memory device to access at least two memory dies among the subset of memory dies corresponding to the stack ID such that the at least two memory dies are non-adjacent.

According to some example embodiments of the inventive concepts, there is provided a memory system including a memory device on a printed circuit board and including a plurality of memory chips stacked in a vertical direction and logic circuitry, and a memory controller adjacent to the memory device on the printed circuit board, configured to generate chip IDs respectively indicating one of the plurality of memory chips, and transmit the generated chip IDs to the memory device, wherein the logic circuitry is configured to cause the memory device to access at least two memory chips among the plurality of memory chips based on the chip IDs such that the at least two memory chips are non-adjacent.

BRIEF DESCRIPTION OF THE DRAWINGS

Some example embodiments of the inventive concepts will be more clearly understood from the following detailed description taken in conjunction with the accompanying drawings in which:

FIG. 14 is a block diagram of a computing system according to an example embodiment.

DETAILED DESCRIPTION

Hereinafter, some example embodiments of the inventive concepts will be described in detail with reference to the accompanying drawings.

Figure 1:
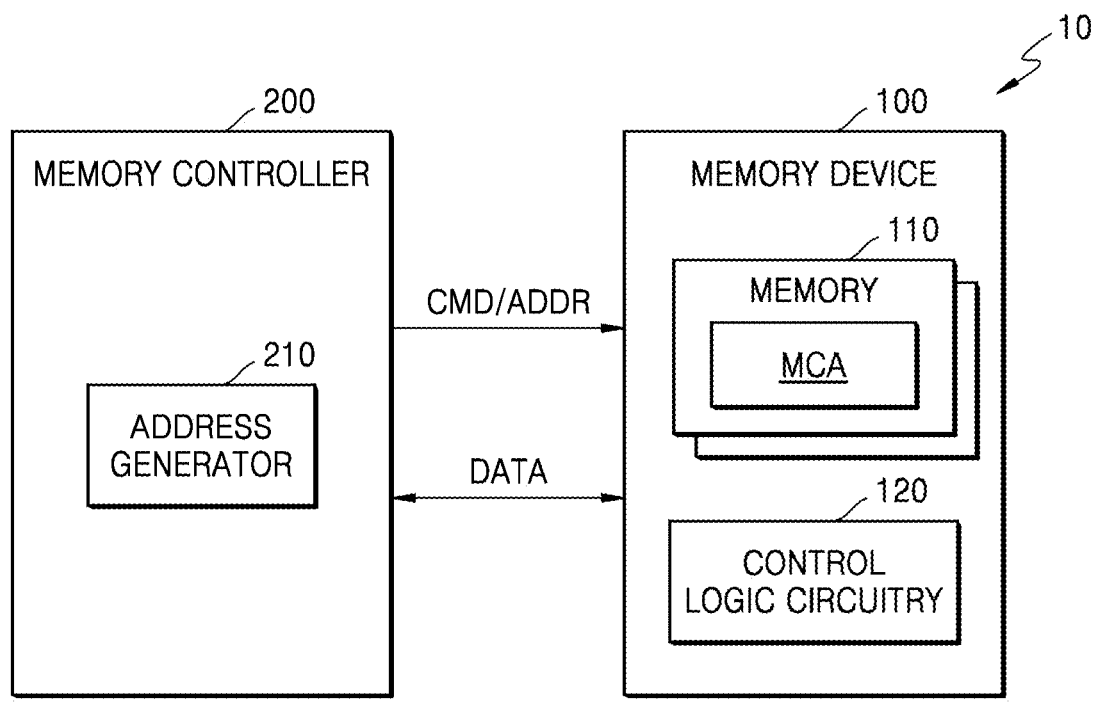
FIG. 1 is a block diagram of a memory system according to an example embodiment.

FIG. 1 is a block diagram of a memory system 10 according to an example embodiment.

Referring to FIG. 1, a memory system 10 may include a memory device 100 and a memory controller 200. The memory device 100 may include a plurality of memories 110 and a control logic circuitry 120, and each or one or more of the plurality of memories 110 may include a memory cell array MCA. The plurality of memories 110 may be stacked with each other in a vertical direction, and accordingly, the memory device 100 may be referred to as a "stacked memory device". Hereinafter, description will be made focusing on example embodiments in which a "memory device" is a "stacked memory device". Accordingly, in this specification, the "memory device" may be used to mean the "stacked memory device".

In an example embodiment, the plurality of memories 110 may be implemented as a plurality of memory dies or core dies, the control logic circuitry 120 may be implemented as a buffer die, and the plurality of memory dies or core dies may be stacked vertically on the buffer die. This will be described later below with reference to FIGS. 3A to 6. In an example embodiment, the plurality of memories 110 may be implemented as a plurality of memory chips, the control logic circuitry 120 may be implemented as a buffer chip, and the plurality of memory chips may be stacked vertically on the buffer chip. In an example embodiment, the plurality of memories 110 may be implemented as a plurality of memory chips, and the control logic circuitry 120 may be included in at least one of the plurality of memory chips or may be included in each or one or more of the plurality of memory chips. This will be described later below with reference to FIGS. 7 to 9.

The memory controller 200 may provide various signals to the memory device 100 to control general memory operations such as writing and reading to and from the memory cell array MCA. In more detail, the memory controller 200 provides a command CMD and an address ADDR to the memory device 100, thereby writing or reading data DATA to or from the memory device 100.

The command CMD may include an active command for switching the memory cell array MCA to an active state for writing or reading data. The memory device 100 may activate a word line included in the memory cell array MCA in response to the active command. In addition, the command CMD may include a precharge command for switching the memory cell array MCA from the active state to a standby state after writing or reading of data is completed. In addition, the command CMD may include a refresh command for controlling a refresh operation for the memory cell array MCA.

In some example embodiments, each or one or more of the plurality of memories 110 or the control logic circuitry 120 may further include a processing element (PE). The memory controller 200 may provide various signals to the memory device 100 to control internal processing operations through the PE. The PE may perform a calculation operation using data received from the memory controller 200. The memory device 100 may provide a result of performing the calculation operation of the PE to the memory controller 200 or other memory devices.

The memory controller 200 may include an address generator 210, and the address generator 210 may access the memory device 100 by generating the address ADDR and providing the generated address ADDR to the memory device 100. The control logic circuitry 120 may receive the address ADDR from the memory controller 200 and determine a stack ID or a chip ID included in the received address ADDR. The control logic circuitry 120 may control an access operation for the plurality of memories 110 according to the determined stack ID or chip ID. The control logic circuitry 120 may control an access operation to the plurality of memories 110 such that two adjacent memories among the plurality of memories 110 are not accessed.

In an example embodiment, the stack ID is randomly or alternately allocated different from or regardless of physical locations of the plurality of memories 110, and accordingly, different stack IDs are allocated to at least two adjacently arranged memories, respectively. In this case, the control logic circuitry 120 may control that two adjacent memories are not accessed, but at least two memories corresponding to the stack ID are accessed. Accordingly, at least two memories apart from each other may be accessed and a hotspot may be reduced or prevented.

However, the inventive concepts are not limited thereto. In some example embodiments, the stack ID is allocated according to the physical locations of the plurality of memories 110, and accordingly, the same stack ID may be allocated to at least two adjacent memories. In this case, the control logic circuitry 120 may control that at least two adjacent memories are not accessed at the same time, but at least two memories including a memory that does not correspond to the stack ID are accessed. Accordingly, at least two memories apart from each other may be accessed and a hotspot may be reduced or prevented.

In an example embodiment, a chip ID is randomly or alternately allocated differently from or regardless of the physical locations of the plurality of memories 110. For example, random chip IDs may be allocated to the plurality of memories 110 differently from or regardless of a stacking order of the plurality of memories 110. In this case, the control logic circuitry 120 may control that two adjacent memories are not accessed, but at least two memories corresponding to the chip IDs are accessed. Accordingly, at least two memories apart from each other may be accessed and a hotspot may be reduced or prevented.

However, the inventive concepts are not limited thereto. In some example embodiments, the chip ID is allocated according to the physical locations of the plurality of memories 110. For example, sequential chip IDs may be allocated to the plurality of memories 110 according to the stacking order of the plurality of memories 110. In this case, the control logic circuitry 120 may control that at least two adjacent memories are not accessed at the same time, but at least two memories including a memory that does not correspond to the chip ID are accessed. Accordingly, at least two memories apart from each other may be accessed and a hotspot may be reduced or prevented.

The memory system 10 may be a data processing system or a configuration included therein. The data processing system may be various types of systems such as a personal computer (PC), a data server, a cloud system, an artificial intelligence server, a network-attached storage (NAS), and an Internet of Things (IoT) device. Alternatively, the data processing system may be various types of portable electronic devices such as a laptop computer, a mobile phone, a smart phone, a tablet PC, a personal digital assistant (PDA), a digital video camera, an audio device, a portable multimedia player (PMP), an MP3 player, a handheld game console, an e-book, a wearable device, and the like.

The memory controller 200 may access the memory device 100 in response to a request from a host. The memory controller 200 may communicate with the host using various protocols. For example, the memory controller 200 may communicate with the host using an interface protocol such as peripheral component interconnect-express (PCI-E), advanced technology attachment (ATA), parallel ATA (PATA), or serial attached small computer system interface (SCSI) (SAS).

Moreover, the memory device 100 may be dynamic random access memory (DRAM) such as double data rate synchronous dynamic random access memory (DDR SDRAM), low power DDR (LPDDR) SDRAM, graphics DDR (GDDR) SDRAM, or Rambus DRAM (RDRAM). However, embodiments are not limited thereto. For example, the memory device 100 may be implemented as a nonvolatile memory such as a flash memory, magnetic RAM (MRAM), ferroelectric RAM (FeRAM), phase change RAM (PRAM), and resistive RAM (ReRAM).

Figure 2:
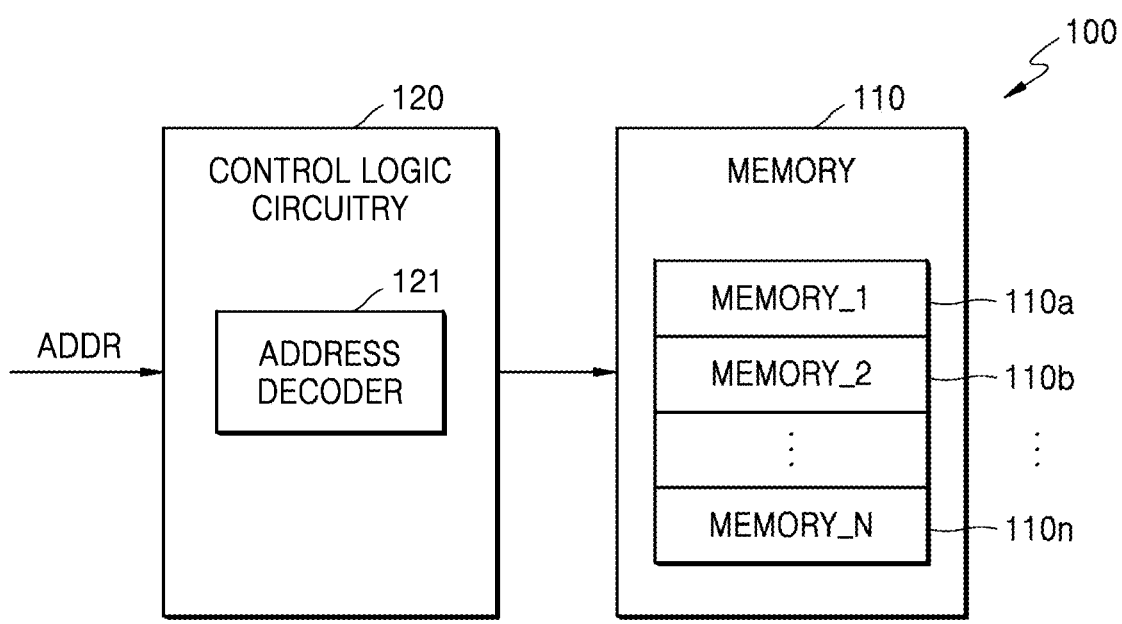
FIG. 2 is a detailed block diagram of a memory device according to an example embodiment.

FIG. 2 is a detailed block diagram of the memory device 100 according to an example embodiment.

Referring to FIG. 2, the memory device 100 may include the plurality of memories 110 and the control logic circuitry 120. The memory device 100 according to the present example embodiment may correspond to the memory device 100 of FIG. 1. The plurality of memories 110 may include first to $N^{th}$ memories 110a, 110b, . . . to 110n sequentially stacked (N is a positive integer greater than or equal to 3). However, the inventive concepts are not limited thereto, and some memories of the plurality of memories 110 are stacked in a vertical direction, and other memories may be arranged in a horizontal direction. For example, the first and second memories 110a and 110b may be stacked in a vertical direction, and the $N^{th}$ memory 110n may be arranged in a horizontal direction with respect to the first and second memories 110a and 110b.

The control logic circuitry 120 may include an address decoder 121. The address decoder 121 may determine a stack ID or a chip ID included in the address ADDR by decoding the address ADDR received from the memory controller 200. The control logic circuitry 120 may determine an access order for the first to $N^{th}$ memories 110a, 110b, . . . to 110n based on the stack ID or the chip ID and may access the first to $N^{th}$ memories 110a, 110b, . . . to 110n according to the determined access order. However, the inventive concepts are not limited thereto, and the address decoder 121 may be arranged outside the control logic circuitry 120.

In an example embodiment, the first to $N^{th}$ memories 110a, 110b, . . . to 110n may be divided into a plurality of stacks. For example, the first to $N^{th}$ memories 110a, 110b, . . . to 110n may be divided into a first stack and a second stack, and accordingly, a first stack ID is allocated to some of the first to $N^{th}$ memories 110a, 110b, . . . to 110n, and a second stack ID may be allocated to other portions of the first to $N^{th}$ memories 110a, 110b, . . . to 110n. For example, among the first to $N^{th}$ memories 110a, 110b, . . . to 110n, a memory to which the first stack ID is allocated and a memory to which the second stack ID is allocated may be apart from each other.

However, the inventive concepts are not limited to the first and second stack IDs, and in some example embodiments, the first to $N^{th}$ memories 110a, 110b, . . . to 110n may be divided into a first stack, a second stack, and a third stack. Accordingly, the first stack ID may be allocated to some of the first to $N^{th}$ memories 110a, 110b, and 110n, the second stack ID may be allocated to some other ones of the first to $N^{th}$ memories 110a, 110b, . . . to 110n, and a third stack ID may be allocated to the other ones of the first to $N^{th}$ memories 110a, 110b, . . . to 110n. Furthermore, the first to $N^{th}$ memories 110a, 110b, . . . to 110n may be divided into four or more stacks, and accordingly, four or more stack IDs may be allocated to the first to $N^{th}$ memories 110a, 110b, . . . to 110n.

When the first stack ID is included in the address ADDR, the control logic circuitry 120 may access memories corresponding to the first stack ID of the first to $N^{th}$ memories 110a, 110b, . . . to 110n such that two adjacent memories are not accessed. For example, the control logic circuitry 120 may sequentially access memories corresponding to the first stack ID among the first to $N^{th}$ memories 110a, 110b, . . . to 110n. Accordingly, memories apart from each other among the first to $N^{th}$ memories 110a, 110b, . . . to 110n may be accessed to reduce or prevent the occurrence of a hotspot in the memory device 100, thereby improving the performance of the memory device 100.

In an example embodiment, the first to $N^{th}$ memories may correspond to a plurality of chip IDs, and the plurality of chip IDs may be allocated differently from or regardless of a stacking order of the first to $N^{th}$ memories 110a, 110b, . . . to 110n. For example, chip IDs may be randomly allocated to the first to $N^{th}$ memories 110a, 110b, . . . to 110n. For example, chip IDs may be alternately allocated to the first to $N^{th}$ memories 110a, 110b, . . . to 110n.

When first and second chip IDs are included in the address ADDR, the control logic circuitry 120 may access memories respectively corresponding to the first and second chip IDs among the first to $N^{th}$ memories 110a, 110b, . . . to 110n such that two adjacent memories are not accessed. For example, the control logic circuitry 120 may sequentially access memories respectively corresponding to the first and second chip IDs among the first to $N^{th}$ memories 110a, 110b, . . . to 110n. Accordingly, memories apart from each other among the first to $N^{th}$ memories 110a, 110b, . . . to 110n may be accessed to reduce or prevent the occurrence of a hotspot in the memory device 100, thereby improving the performance of the memory device 100.

In some example embodiments, the memory device 100 may further include a temperature sensor. For example, the temperature sensor may be arranged adjacent to at least one of the first to $N^{th}$ memories 110a, 110b, . . . to 110n. For example, the temperature sensor may be included in at least one of the first to $N^{th}$ memories 110a, 110b, . . . to 110n. The temperature sensor may sense temperatures of the first to $N^{th}$ memories 110a, 110b, . . . to 110n, and the control logic circuitry 120 may dynamically adjust stack IDs or chip IDs corresponding to the first to $N^{th}$ memories 110a, 110b, . . . to 110n based on the sensed temperatures.

Figure 3A:
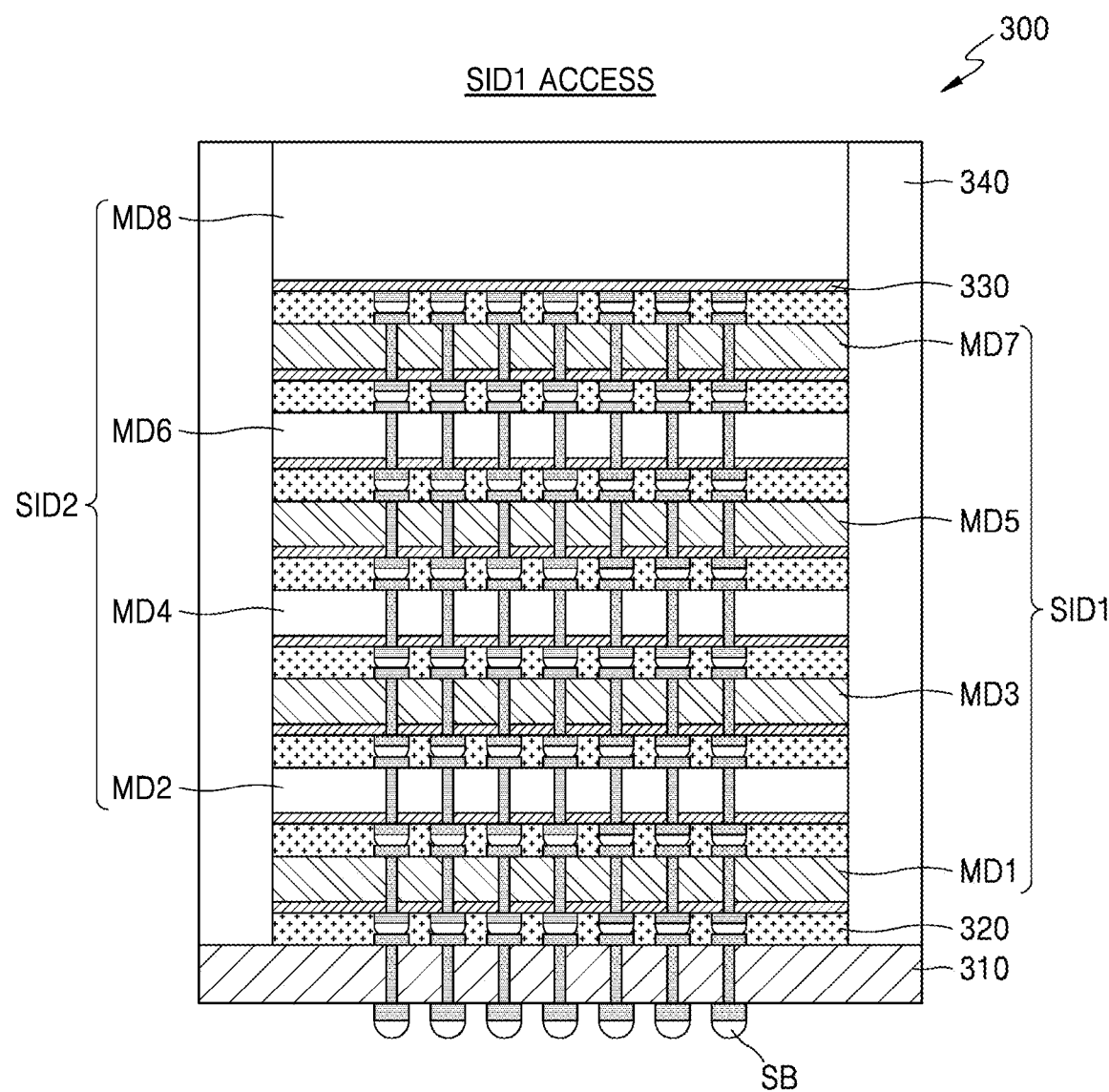
FIGS. 3A and 3B are views of a memory device according to an example embodiment.
Figure 3B:
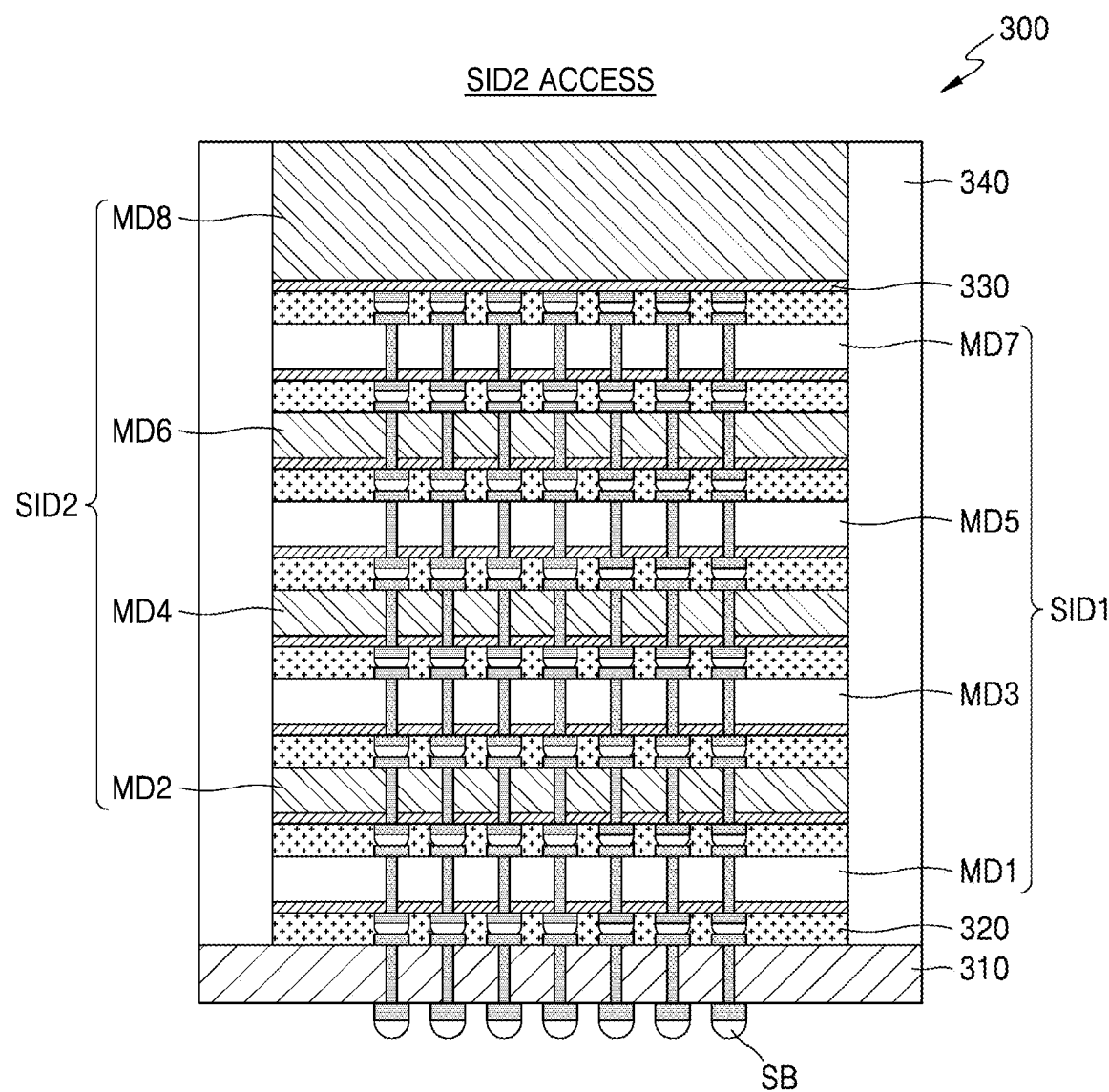

FIGS. 3A and 3B show a memory device 300 according to an example embodiment.

Referring to FIG. 3A, the memory device 300 may include a buffer die 310 and a plurality of core dies MD1 to MD8. For example, the memory device 300 may be high bandwidth memory (HBM). Each or one or more of the plurality of core dies MD1 to MD8 may include a plurality of memory cells, and accordingly, the plurality of core dies MD1 to MD8 may be referred to as a plurality of memory dies. The plurality of core dies MD1 to MD8 may correspond to one implementation of the first to $N^{th}$ memories 110a, 110b, . . . to 110n of FIG. 2. Moreover, the buffer die 310 may not include a memory cell. The plurality of core dies MD1 to MD8 may be sequentially stacked on the buffer die 310. Although 8 core dies are illustrated in FIG. 3A, the inventive concepts are not limited thereto, and the number of core dies stacked on the buffer die 310 may be variously changed. A horizontal size of the buffer die 310 may be greater than a horizontal size of each or one or more of the plurality of core dies MD1 to MD8.

A first stack ID SID1 may be allocated to the odd-numbered core dies MD1, MD3, MD5, and MD7 among the plurality of core dies, and a second stack ID SID2 may be allocated to the even-numbered core dies MD2, MD4, MD6, and MD8 among the plurality of core dies MD1 to MD8. When the first stack ID SID1 is activated, the core dies MD1, MD3, MD5, and MD7 corresponding to the first stack ID SID1 may be accessed. Accordingly, a hotspot in the memory device 300 may be reduced or prevented from occurring because adjacent core dies are not simultaneously accessed. For example, the address ADDR may include the first stack ID SID1, and a control logic circuitry (e.g., 120 of FIG. 1) may sequentially access the core dies MD1, MD3, MD5, and MD7 based on the first stack ID SID1. However, the inventive concepts are not limited thereto, and in some example embodiments, a control logic circuitry (e.g., 120 of FIG. 1) may simultaneously access the core dies MD1, MD3, MD5, and MD7 based on the first stack ID SID1.

The buffer die 310 and the plurality of core dies MD1 to MD8 may be electrically connected to each other through TSVs. In an example embodiment, the buffer die 310 may be electrically connected to the core dies MD1, MD3, MD5, and MD7 corresponding to the first stack ID SID1 through the first TSVs. In this case, the first TSVs may not be electrically connected to the core dies MD2, MD4, MD6, and MD8 corresponding to the second stack ID SID2. In an example embodiment, the buffer die 310 may be electrically connected to the core dies MD2, MD4, MD6, and MD8 corresponding to the second stack ID SID2 through the second TSVs. The second TSVs may not be electrically connected to the core dies MD1, MD3, MD5, and MD7 corresponding to the first stack ID SID1.

Solder bumps SB may be arranged on one surface of the buffer die 310, and the buffer die 310 may be mounted on an interposer or a printed circuit board through the solder bumps SB. An underfill layer 320 may be arranged between the plurality of core dies MD1 to MD8 and between the core die MD1 and the buffer die 310. For example, the underfill layer 320 may be arranged through a capillary underfill (CUF) process, a molded underfill (MUF) process, a thermal compression-nonconductive paste (TC-NCP) process, or a thermal compression-non conductive film (TC-NCF) process.

In an example embodiment, the solder bumps SB may correspond to input/output pins. For example, the memory device 300 may include 1024 input/output pins, and accordingly, 1024 solder bumps SB may be arranged on one surface of the buffer die 310. As such, the memory device 300 may be implemented as an HBM device supporting a wide input/output interface and may perform high-speed data processing using the memory device 300.

An active layer 330 may be arranged on one surface of each or one or more of the plurality of core dies MD1 to MD8. A vertical length of the core die MD8 arranged on the top of the plurality of core dies MD1 to MD8 may be greater than vertical lengths of the other core dies. A side mold member 340 may be arranged on a side surface of the plurality of core dies, and an upper surface of the core die MD8 arranged on the top of the plurality of core dies MD1 to MD8 may be exposed.

Referring to FIG. 3B, when the second stack ID SID2 is activated, the core dies MD2, MD4, MD6, and MD8 corresponding to the second stack ID SID2 may be accessed. Accordingly, a hotspot in the memory device 300 may be reduced or prevented from occurring because adjacent core dies are not simultaneously accessed. For example, the address ADDR may include the second stack ID SID2, and the control logic circuitry 120 may access the core dies MD2, MD4, MD6, and MD8 based on the second stack ID SID2.

Figure 4:
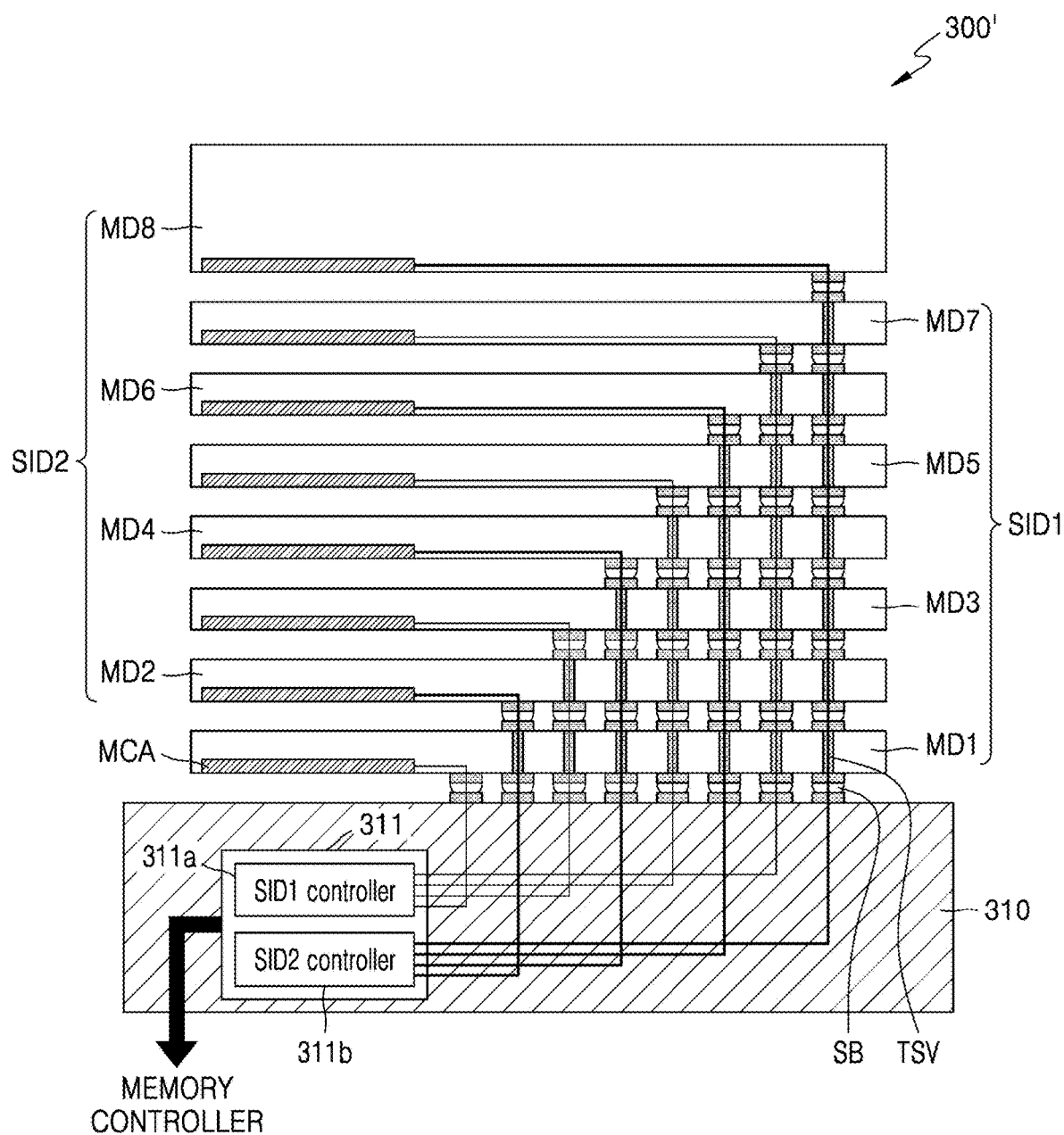
FIG. 4 is a view of a memory device according to an example embodiment.

FIG. 4 shows a memory device 300' according to an example embodiment.

Referring to FIG. 4, the memory device 300' may correspond to an implementation of the memory device 300 illustrated in FIGS. 3A and 3B. The buffer die 310 may include a control logic circuitry 311, and the control logic circuitry 311 may correspond to, for example, an implementation of the control logic circuitry 120 of FIGS. 1 and 2. For example, the control logic circuitry 311 may include a first stack ID controller 311a and a second stack ID controller 311b. However, the configuration of the control logic circuitry 311 is not limited thereto, and may include stack ID controllers corresponding to the number of stack IDs for the memory device 300'.

The first stack ID controller 311a may control an access operation to core dies (e.g., MD1, MD3, MD5, and MD7) corresponding to the first stack ID SID1 among the plurality of core dies MD1 to MD8 in response to the address ADDR received from a memory controller (e.g., 200 in FIG. 1). For example, the first stack ID controller 311a may control an access operation to the memory cell array MCA of the first core die MD1 through a solder bump SB in response to the address ADDR including the first stack ID SID1. For example, the first stack ID controller 311a may control an access operation to the memory cell array MCA of the third core die MD3 through the solder bump SB and TSV in response to the address ADDR including the first stack ID SID1. Although four connection lines are illustrated in FIG. 4, the inventive concepts are not limited thereto, and the number of connection lines between the first stack ID controller 311a and core dies may vary. For example, at least one switch may be connected between the first stack ID controller 311a and each core die, the connections between the first stack ID controller 311a and the each core die may be dynamically changed by controlling the at least one switch.

The second stack ID controller 311b may control an access operation to core dies (e.g., MD2, MD4, MD6, and MD8) corresponding to the second stack ID SID2 among the plurality of core dies MD1 to MD8 in response to the address ADDR received from a memory controller (e.g., 200 in FIG. 1). For example, the second stack ID controller 311b may control an access operation to the memory cell array MCA of the second core die MD2 through the solder bump SB and TSV in response to the address ADDR including the second stack ID SID2. For example, the second stack ID controller 311b may control an access operation to the memory cell array MCA of the fourth core die MD4 through the solder bump SB and TSV in response to the address ADDR including the second stack ID SID2. Although four connection lines are illustrated in FIG. 4, the inventive concepts are not limited thereto, and the number of connection lines between the second stack ID controller 311b and core dies may vary. For example, at least one switch may be connected between the second stack ID controller 311b and each core die, the connections between the second stack ID controller 311b and the each core die may be dynamically changed by controlling the at least one switch.

In an example embodiment, core dies corresponding to the first stack ID SID1 may be dynamically changed, and accordingly, a connection relationship between the first stack ID controller 311a and the core dies may be changed. For example, when heat is concentrated in a lower portion of the core dies MD1 to MD8, the core dies corresponding to the first stack ID SID1 may be changed to the fourth, sixth to eighth core dies MD4, MD6, MD7, and MD8, and accordingly, the first stack ID controller 311a may control access operations to the fourth, sixth to eighth core dies MD4, MD6, MD7, and MD8.

Similarly, core dies corresponding to the second stack ID SID2 may also be dynamically changed, and accordingly, a connection relationship between the second stack ID controller 311b and the core dies may be changed. For example, when heat is concentrated in an upper portion of the core dies MD1 to MD8, the core dies corresponding to the second stack ID SID2 may be changed to the first, second, fourth, and fifth core dies MD1, MD2, MD4, and MD5, and accordingly, the second stack ID controller 311b may control access operations to the first, second, fourth, and fifth core dies MD1, MD2, MD4, and MD5.

Figure 5A:
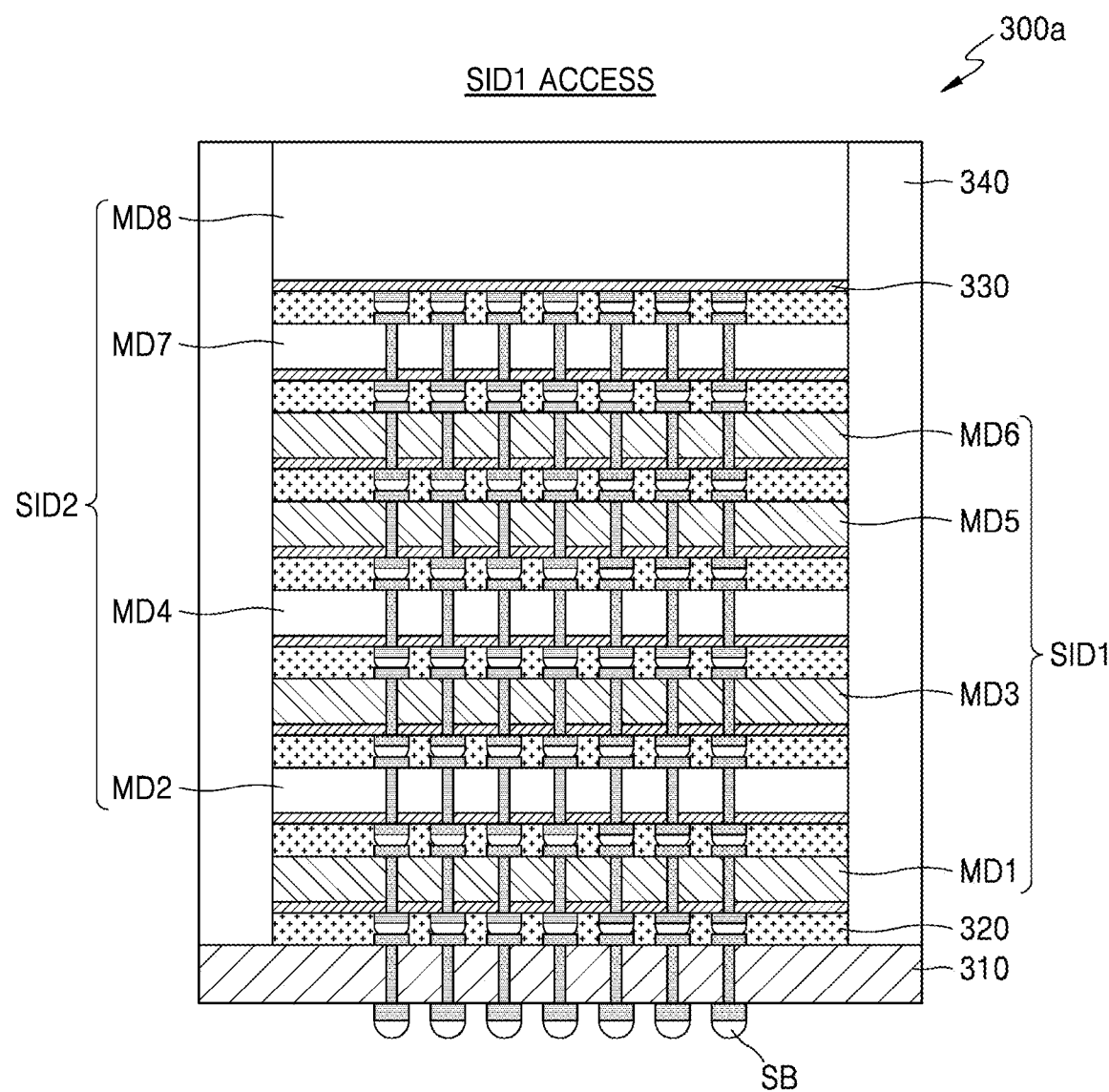
FIGS. 5A and 5B are views of a memory device according to an example embodiment.
Figure 5B:
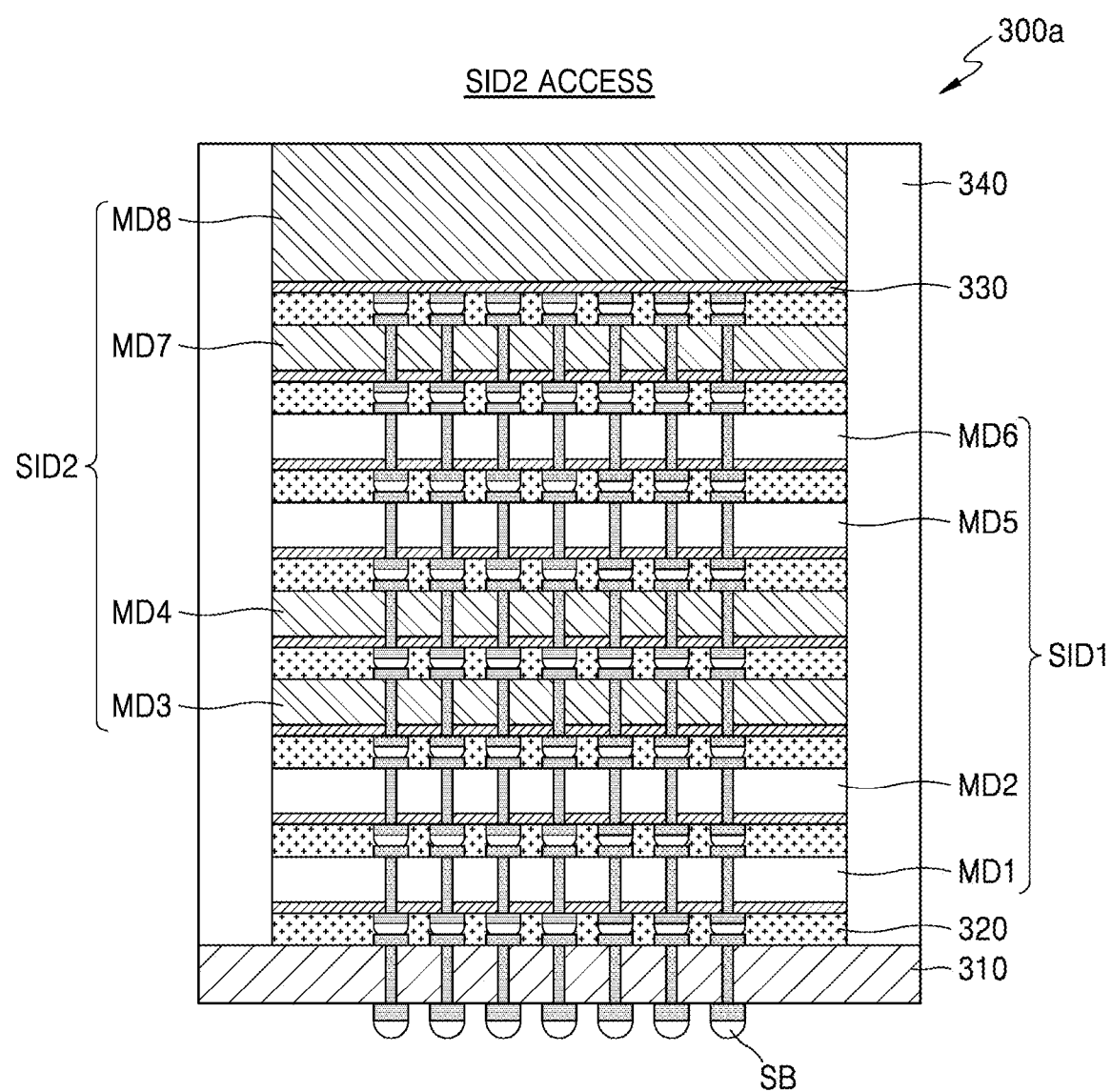

FIGS. 5A and 5B show a memory device 300a according to an example embodiment.

Referring to FIG. 5A, the memory device 300a may include the buffer die 310 and the plurality of core dies MD1 to MD8. The memory device 300a according to the present example embodiment corresponds to a modification of the memory device 300 of FIG. 3A, and a difference from the memory device 300 of FIG. 3A will be mainly described.

Among the plurality of core dies MD1 to MD8, the first stack ID SID1 may be allocated to the first, second, fifth, and sixth core dies MD1, MD2, MD5, and MD6, and the second stack ID SID2 may be allocated to the third, fourth, seventh and eighth core dies MD3, MD4, MD7, and MD8. As such, according to the present example embodiment, some of core dies corresponding to identical stack IDs are adjacent to each other and the rest may be apart from each other. In more detail, the first and second core dies MD1 and MD2 may be adjacent to each other, the fifth and sixth core dies MD5 and MD6 may be adjacent to each other, and the second and fifth core dies MD2 and MD5 may be apart from each other.

When the first stack ID SID1 is activated, the core dies MD1, MD2, MD5, and MD6 corresponding to the first stack ID SID1 may be accessed, and heat generating portions may be distributed compared to a case where the four core dies MD1 to MD4 adjacent to each other are accessed. For example, the core dies MD1, MD2, MD5, and MD6 corresponding to the first stack ID SID1 may be sequentially accessed. Accordingly, a hotspot in the memory device 300a may be reduced or prevented from occurring. For example, the address ADDR may include the first stack ID SID1, and a control logic circuitry (e.g., 120 in FIG. 1) may access the core dies MD1, MD2, MD5, and MD6 based on the first stack ID SID1.

Referring to FIG. 5B, when the second stack ID SID2 is activated, the core dies MD3, MD4, MD7, and MD8 corresponding to the second stack ID SID2 may be accessed, and heat generating portions may be distributed compared to a case where the four core dies MD5 to MD8 adjacent to each other are accessed. For example, the core dies MD3, MD4, MD7, and MD8 corresponding to the second stack ID SID2 may be sequentially accessed. Accordingly, a hotspot in the memory device 300a may be reduced or prevented from occurring. For example, the address ADDR may include the second stack ID SID2, and a control logic circuitry (e.g., 120 in FIG. 1) may access the core dies MD3, MD4, MD7, and MD8 based on the second stack ID SID2. In some example embodiments, the buffer die 310 of the memory device 300a illustrated in FIGS. 5A and 5B may also include a control logic circuitry similar to FIG. 4.

Figure 6:
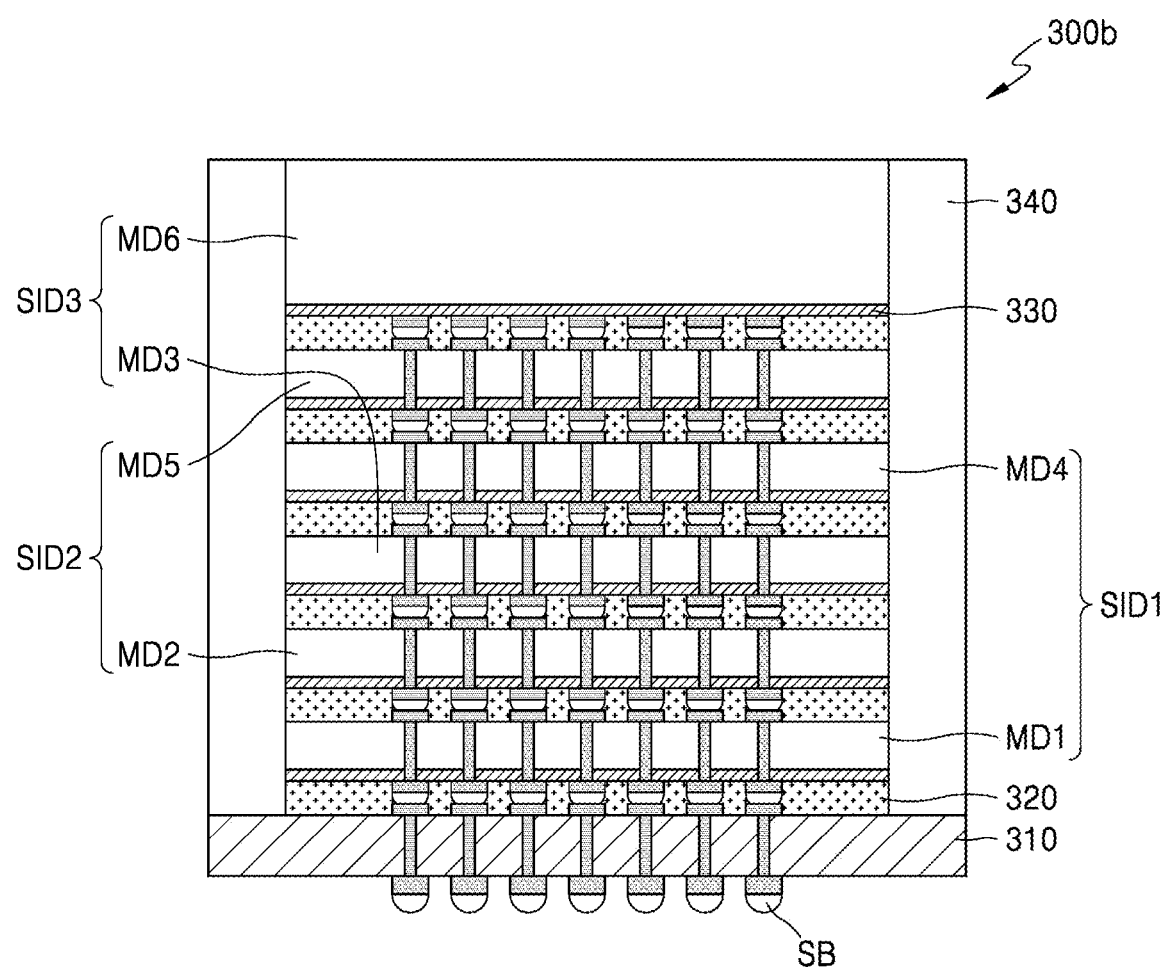
FIG. 6 is a view of a memory device according to an example embodiment.

FIG. 6 shows a memory device 300b according to an example embodiment of the inventive concepts.

Referring to FIG. 6, the memory device 300b may include the buffer die 310 and the plurality of core dies MD1 to MD6. The memory device 300b according to the present example embodiment corresponds to a modification of the memory device 300 of FIG. 3A, and a difference from the memory device 300 of FIG. 3A will be mainly described. The plurality of core dies MD1 to MD6 may be sequentially stacked on the buffer die 310. Although six core dies are illustrated in FIG. 6, the inventive concepts are not limited thereto, and the number of core dies stacked on the buffer die 310 may vary.

Among the plurality of core dies MD1 to MD6, the first stack ID SID1 may be allocated to the first and fourth core dies MD1 and MD4, the second stack ID SID2 may be allocated to the second and fifth core dies MD2 and MD5, and the third stack ID SID3 may be allocated to the third and sixth core dies MD3 and MD6. For example, when the first stack ID SID1 is activated, the core dies MD1 and MD4 corresponding to the first stack ID SID1 may be accessed. Accordingly, a hotspot in the memory device 300b may be reduced or prevented from occurring because adjacent core dies are not simultaneously accessed. For example, the address ADDR may include the first stack ID SID1, and a control logic circuitry (e.g., 120 in FIG. 1) may access the core dies MD1 and MD4 based on the first stack ID SID1. In some example embodiments, the buffer die 310 of the memory device 300b illustrated in FIG. 6 may also include a control logic circuitry similar to FIG. 4. The control logic circuitry included in the buffer die 310 may include the first stack ID controller, the second stack ID controller, and the third stack ID controller.

Figure 7:
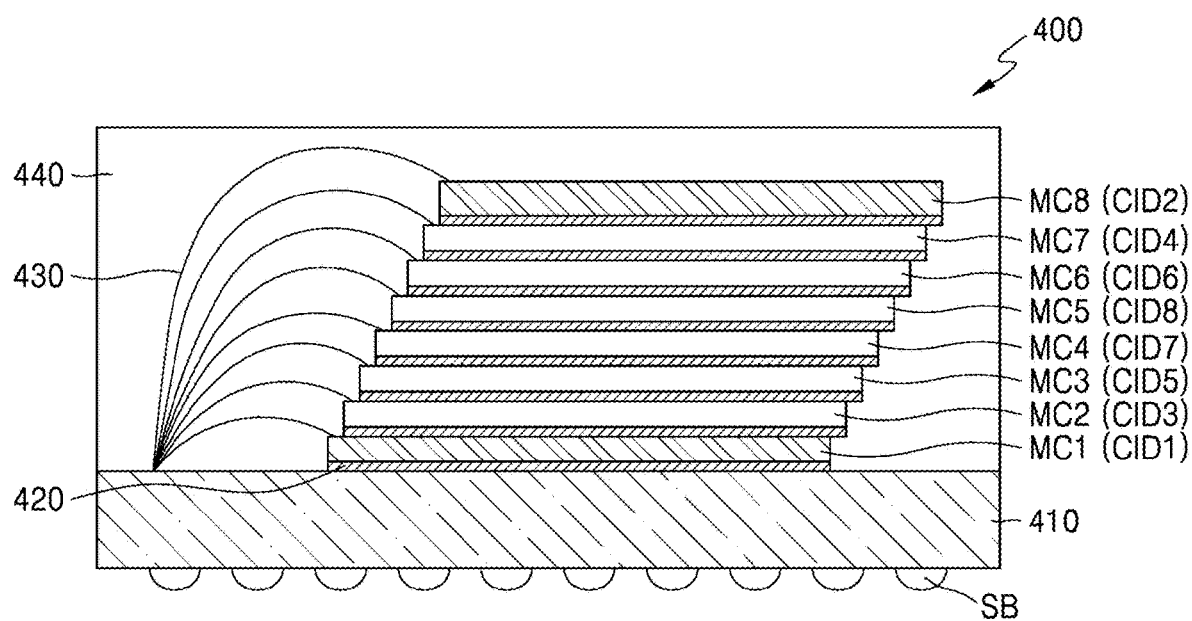
FIG. 7 is a view of a memory device according to an example embodiment.

FIG. 7 shows a memory device 400 according to an example embodiment.

Referring to FIG. 7, the memory device 400 may include a printed circuit board 410 and a plurality of memory chips MC1 to MC8. For example, the memory device 400 may be a memory device that communicates with an external device, for example, a memory controller according to a double data rate (DDR) interface, an LPDDR interface, or a GDDR interface. The plurality of memory chips MC1 to MC8 may correspond to an implementation of the first to $N^{th}$ memories 110a, 110b, . . . to 110n in FIG. 2. The plurality of memory chips MC1 to MC8 may be sequentially stacked on the printed circuit board 410. Although eight memory chips are illustrated in FIG. 7, the inventive concepts are not limited thereto, and the number of memory chips stacked on the printed circuit board 410 may vary.

In an example embodiment, chip IDs may be randomly or alternately allocated to the plurality of memory chips MC1 to MC8. For example, a first chip ID CID1 may be allocated to the memory chip MC1, a third chip ID CID3 may be allocated to the memory chip MC2, a fifth chip ID CID5 may be allocated to the memory chip MC3, a seventh chip ID CID7 may be allocated to the memory chip MC4, an eighth chip ID CID8 may be allocated to the memory chip MC5, a sixth chip ID CID6 may be allocated to the memory chip MC6, a fourth chip ID CID4 may be allocated to the memory chip MC7, and a second chip ID CID2 may be allocated to the memory chip MC8. For example, when the first and second chip IDs CID1 and CID2 are activated, the memory chips MC1 and MC8 apart from each other corresponding to the first and second chip IDs CID1 and CID2 may be accessed. Accordingly, a hotspot in the memory device 400 may be reduced or prevented from occurring because adjacent memory chips are not simultaneously accessed. For example, the address ADDR may include the first and second chip IDs CID1 and CID2, and a control logic circuitry (e.g., 120 of FIG. 1) may access the memory chips MC1 and MC8 based on the first and second chip IDs CID1 and CID2.

The solder bumps SB may be arranged on one surface of the printed circuit board 410, and the printed circuit board 410 may be mounted on a package substrate or a motherboard through the solder bumps SB. An underfill layer 420 including an adhesive film such as a non conductive film (NCF), an anisotropic conductive film (ACF), a UV film, or the like may be arranged between the plurality of memory chips MC1 to MC8 and between the memory chip MC1 and the printed circuit board 410. The printed circuit board 410 may be electrically connected to the plurality of memory chips MC1 to MC8 through a wire bonding 430. A mold member 440 including, for example, an epoxy molding compound (EMC) may be on the printed circuit board 410 and the plurality of memory chips MC1 to MC8.

In some example embodiments, a memory controller may further be arranged on the printed circuit board 410 adjacent to the plurality of memory chips MC1 to MC8. In this case, the memory device 400 and the memory controller may be referred to as a memory system. The memory controller may generate chip IDs each or one or more of the chip IDs indicating one of the memory chips MC1 to MC8, and may transfer the generated chip IDs to the memory device 400. The memory device 400 may access at least two memory chips apart from each other among the plurality of memory chips MC1 to MC8 based on the chip IDs. In some example embodiments, each or one or more of the plurality of memory chips MC1 to MC8 may include a calculation circuit that performs calculation processing using data received from the memory controller.

Figure 8:
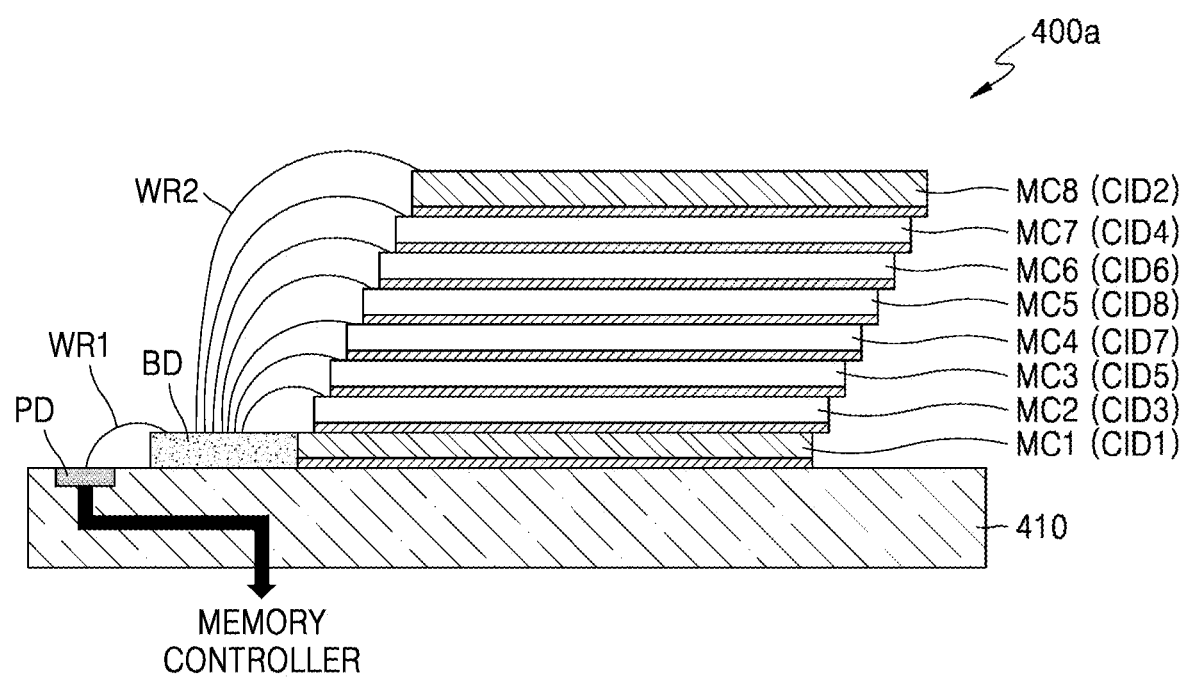
FIG. 8 is a view of a memory device according to an example embodiment.

FIG. 8 shows a memory device 400a according to an example embodiment.

Referring to FIG. 8, the memory device 400a may correspond to an implementation of the memory device 400 illustrated in FIG. 7. Hereinafter, a difference between the memory device 400 of FIG. 7 and the memory device 400a according to the present example embodiment will be mainly described.

The memory device 400a may further include a buffer die BD, and the buffer die BD may be arranged at the same level as that of the first memory chip MC1. In an example embodiment, the buffer die BD and the first memory chip MC1 may be implemented as the same chip formed on one wafer. However, the inventive concepts are not limited thereto, and in an example embodiment, the buffer die BD and the first memory chip MC1 are formed of individual chips and may be arranged adjacent to each other.

A pad PD and the buffer die BD on the printed circuit board 410 may be electrically connected to each other through a first wire WR1, and the buffer die BD and the second to eighth memory chips MC2 to MC8 may be connected to each other through second wires WR2. The buffer die BD and the first memory chip MC1 arranged on the same level may be electrically connected to each other through an internal wire. The pad PD may be electrically connected to a memory controller (e.g., 200 in FIG. 1).

The buffer die BD may receive an address from the memory controller through the pad PD and may control access operations to the first to eighth memory chips MC1 to MC8 based on the received address. For example, the buffer die BD may include a control logic circuitry capable of dynamically changing chip IDs for the first to eighth memory chips MC1 to MC8.

In an example embodiment, the buffer die BD may randomly or alternately allocate chip IDs to the first to eighth memory chips MC1 to MC8. For example, the buffer die BD may control access operations to the memory chips MC1 and MC8 apart from each other corresponding to the first and second chip IDs CID1 and CID2, respectively, in response to an address including the first and second chip IDs CID1 and CID2. Accordingly, a hotspot in the memory device 400a may be reduced or prevented from occurring because adjacent memory chips are not simultaneously accessed.

In an example embodiment, the buffer die BD may dynamically change chip IDs corresponding to the first to eighth memory chips MC1 to MC8. For example, when heat is concentrated in a lower portion of the first to eighth memory chips MC1 to MC8, the buffer die BD may change memory chips corresponding to the first and second chip IDs CID1 and CID2 to the fifth and seventh memory chips MC5 and MC7. Accordingly, heat may be distributed in real time during the operation of the memory device 400a.

Figure 9:
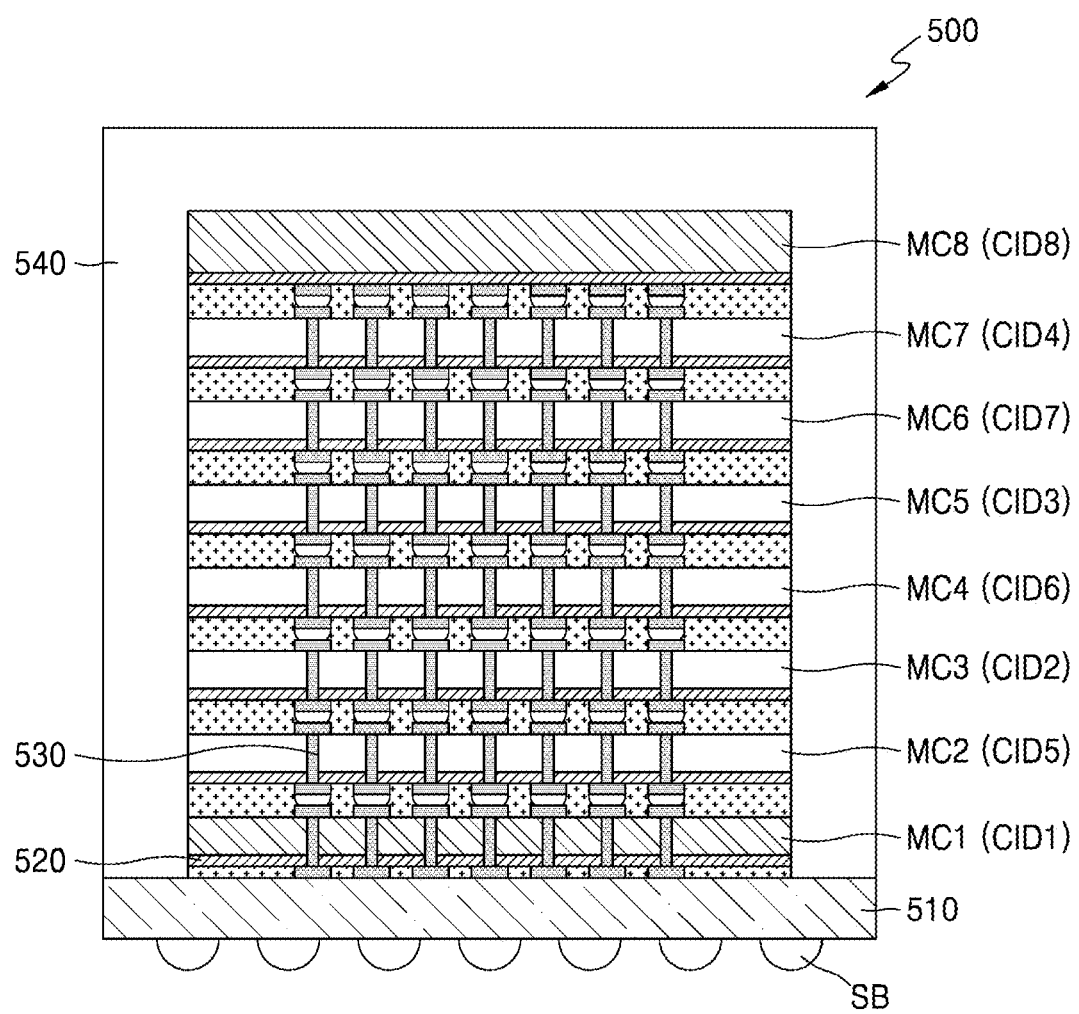
FIG. 9 is a view of a memory device according to an example embodiment.

FIG. 9 shows a memory device 500 according to an example embodiment.

Referring to FIG. 9, the memory device 500 may include a printed circuit board 510 and the plurality of memory chips MC1 to MC8. For example, the memory device 500 may be a memory device that communicates with an external device, for example, a memory controller according to a DDR interface, an LPDDR interface, or a GDDR interface. The plurality of memory chips MC1 to MC8 may correspond to an implementation of the first to $N^{th}$ memories 110a, 110b, ... to 110n in FIG. 2. The plurality of memory chips MC1 to MC8 may be sequentially stacked on the printed circuit board 510. Although eight memory chips are illustrated in FIG. 9, the inventive concepts are not limited thereto, and the number of memory chips stacked on the printed circuit board 510 may vary.

In an example embodiment, chip IDs may be randomly or alternately allocated to the plurality of memory chips MC1 to MC8. For example, the first chip ID CID1 may be allocated to the memory chip MC1, the fifth chip ID CID5 may be allocated to the memory chip MC2, the second chip ID CID2 may be allocated to the memory chip MC3, the sixth chip ID CID6 may be allocated to the memory chip MC4, the third chip ID CID3 may be allocated to the memory chip MC5, the seventh chip ID CID7 may be allocated to the memory chip MC6, the fourth chip ID CID4 may be allocated to the memory chip MC7, and the eighth chip ID CID8 may be allocated to the memory chip MC8. For example, when the first and second chip IDs CID1 and CID2 are activated, the memory chips MC1 and MC3 apart from each other corresponding to the first and second chip IDs CID1 and CID2 may be accessed. Accordingly, a hotspot in the memory device 400 may be reduced or prevented from occurring because adjacent memory chips are not simultaneously accessed. For example, the address ADDR may include the first and second chip IDs CID1 and CID2, and a control logic circuitry (e.g., 120 of FIG. 1) may access the memory chips MC1 and MC3 based on the first and second chip IDs CID1 and CID2.

The solder bumps SB may be arranged on one surface of the printed circuit board 510, and the printed circuit board 510 may be mounted on a package substrate or a motherboard through the solder bumps SB. An underfill layer 520 including an adhesive film such as an NCF, an ACF, a UV film, or the like may be arranged between the plurality of memory chips MC1 to MC8 and between the memory chip MC1 and the printed circuit board 510. The printed circuit board 510 may be electrically connected to the plurality of memory chips MC1 to MC8 through TSVs 530. A mold member 540 including, for example, an EMC may be on the printed circuit board 510 and the plurality of memory chips MC1 to MC8.

In some example embodiments, a memory controller may further be arranged on the printed circuit board 510 adjacent to the plurality of memory chips MC1 to MC8. In this case, the memory device 500 and the memory controller may be referred to as a memory system. The memory controller may generate chip IDs each or one or more of the chip IDs indicating one of the memory chips MC1 to MC8 and may transfer the generated chip IDs to the memory device 500. The memory device 500 may access at least two memory chips apart from each other among the plurality of memory chips MC1 to MC8 based on the chip IDs. In some example embodiments, each or one or more of the plurality of memory chips MC1 to MC8 may include a calculation circuit that performs calculation processing using data received from the memory controller.

Figure 10:
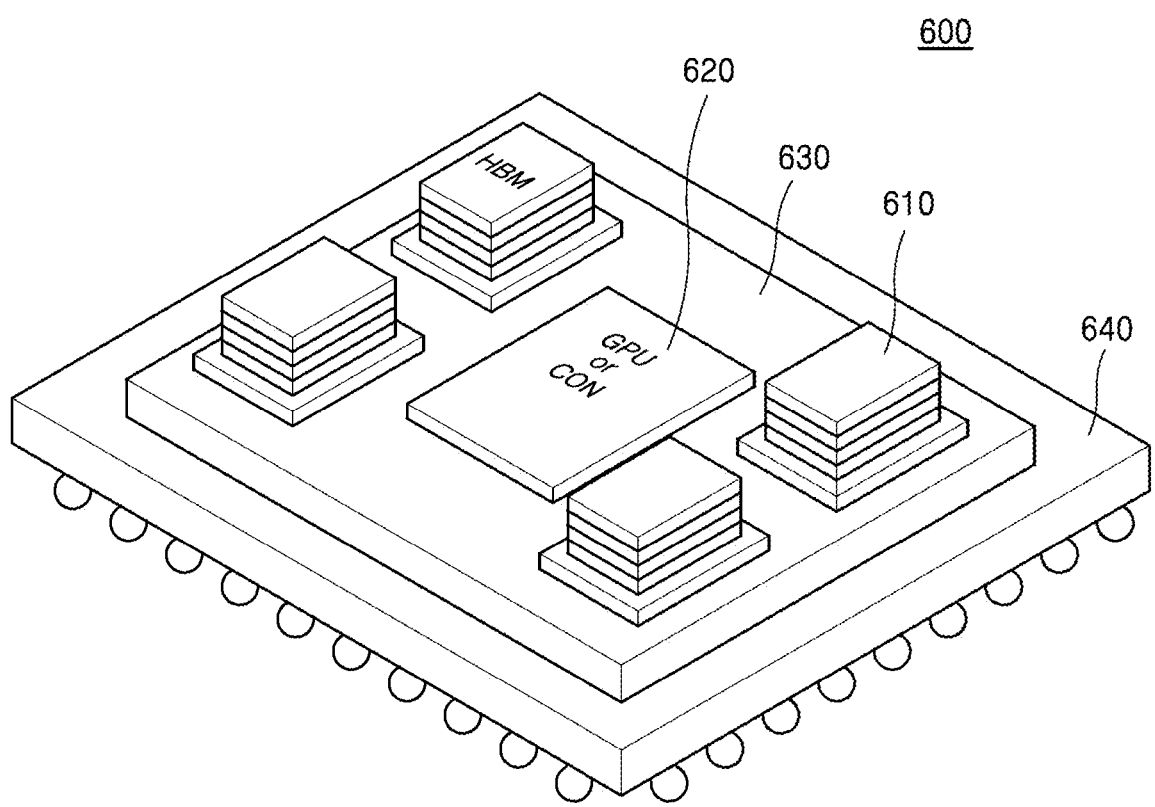
FIG. 10 is a view of an HBM module according to an example embodiment.

FIG. 10 shows an HBM module 600 according to an example embodiment.

Referring to FIG. 10, the memory device or the memory system described above may include an HBM 610, and the memory system shown in FIG. 10 may be defined as the HBM module 600 including a plurality of HBMs 610. The HBM module 600 may include a package substrate 640, an interposer 630, and the plurality of HBMs 610 and at least one controller 620 mounted on the interposer 630.

The plurality of HBMs 610 may be arranged on the interposer 630 and may include a plurality of memory dies stacked in a vertical direction, respectively. The controller 620 is arranged adjacent to the HBMs 610 on the interposer 630, and may generate a stack ID indicating some of the plurality of memory dies included in each or one or more of the HBMs 610 and may transfer the generated stack ID to each or one or more of the HBMs 610. In this case, each or one or more HBM 610 may access at least two memory dies apart from each other among some memory dies corresponding to the stack ID. In some example embodiments, each or one or more of the plurality of memory chips may include a calculation circuit that performs calculation processing using data received from the controller 620.

For example, the memory controller according to the above-described example embodiments may correspond to the controller 620 shown in FIG. 10. Alternatively, various types of controllers including a memory control function may correspond to the controller 620, and for example, a hardware accelerator such as a graphics processing unit (GPU) may correspond to the controller 620. The hardware accelerator such as a GPU may include the functions of the memory controller described above. In addition, the controller 620 may include processing circuitry or hardware accelerators including logic circuits; a hardware/software combination such as a processor executing software; or a combination thereof. For example, the processing circuitry more specifically may include, but is not limited to a field-programmable gate array (FPGA), a massively parallel processor array (MPPA), an application-specific integrated circuit (ASIC), a neural processing unit (NPU), a tensor processing unit (TPU), and a multi-processor system-on-chip (MPSoC) may be applied to the controller 620.

The plurality of HBMs 610 and the controller 620 may exchange signals with each other through wires formed in the interposer 630. The interposer 630 may include a wire such as an embedded multi-die interconnect bridge (EMIB) of an organic or non-through-silicon via TSV) method with a TSV silicon or a printed circuit board type. As a variant embodiment, the HBM module 600 may include only the plurality of HBMs 610 without the controller 620.

According to an example embodiment, each or one or more of the HBMs 610 may include a buffer die (or logic die) that includes a peripheral circuit for controlling a memory operation and one or more core dies that include a memory cell array and are stacked on the buffer die. In each or one or more of the HBMs 610, a control logic circuitry may be arranged in each or one or more of the HBMs 610. However, example embodiments of the inventive concepts are not limited thereto. The control logic circuitry may be variously located in the HBM module 600. Each or one or more of the plurality of HBMs 610 may perform a memory operation according to the above-described example embodiments. For example, each or one or more HBM 610 may perform access operations to the core dies differently from or regardless of a stacking order of the core dies, that is, based on a stack ID allocated randomly or alternately.

Figure 11:
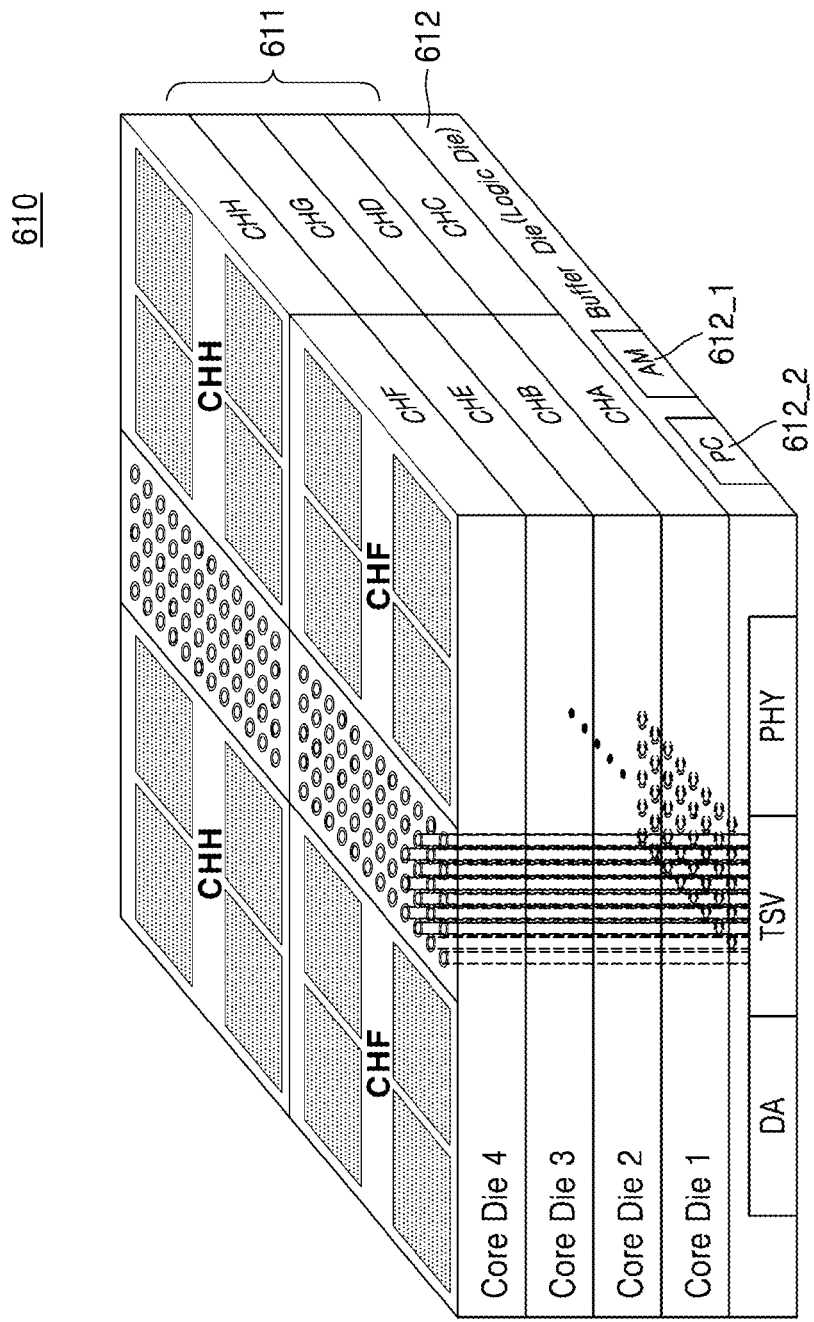
FIG. 11 is a view of HBM according to an example embodiment.

FIG. 11 shows the HBM 610 according to an example embodiment.

Referring to FIGS. 10 and 11 together, the HBM 610 may have an increased bandwidth by including a plurality of channels having interfaces independent of each other. As an example, the HBM 610 may include a plurality of dies and may include, for example, a buffer die (or a logic die) 612 and one or more core dies 611 stacked on the buffer die. In an example of FIG. 11, first to fourth core dies are provided in the HBM 610, but the number of core dies 611 may vary.

The buffer die 612 may communicate with the controller (or a hardware accelerator) 620, may receive commands, addresses, and data from the controller 620, and may provide the received commands, addresses, and data to the core dies 611. The buffer die 612 may communicate with the controller 620 through a conductive unit (not shown) such as a bump formed on the outer surface thereof. The buffer die 612 may buffer the commands, addresses, and data so that the controller 620 may interface with the core dies 611 by driving only a load of the buffer die 612.

Furthermore, the HBM 610 may include a plurality of TSVs through dies. The TSVs may be arranged corresponding to channels, and when each or one or more channel has a bandwidth of 128 bits, the TSVs may include configurations for 1024 bits of data input/output.

The buffer die 612 may include a TSV region TSV, a physical region PHY, and a direct access region DA. The TSV region TSV is a region where a TSV for communication with the core dies 613 is formed. The physical region PHY may include a plurality of input and output circuits for communication with the controller 620 and the direct access area DA may directly communicate with an external tester through a conductive unit that is arranged on an outer surface of the HBM 610 in a test mode for the HBM 610. Various signals provided from the tester may be provided to the core dies 611 through the direct access region DA and the TSV region TSV.

The HBM module 600 may be used for processing of data for various purposes, and the HBM module 600 may be used for a neural network operation according to an example embodiment. As an example, the HBM module 600 may perform neural network operations according to various types of models such as convolutional neural networks (CNN), recurrent neural networks (RNN), multi-layer perceptron (MLP), deep belief networks, and restricted Boltzmann machines.

Figure 12:
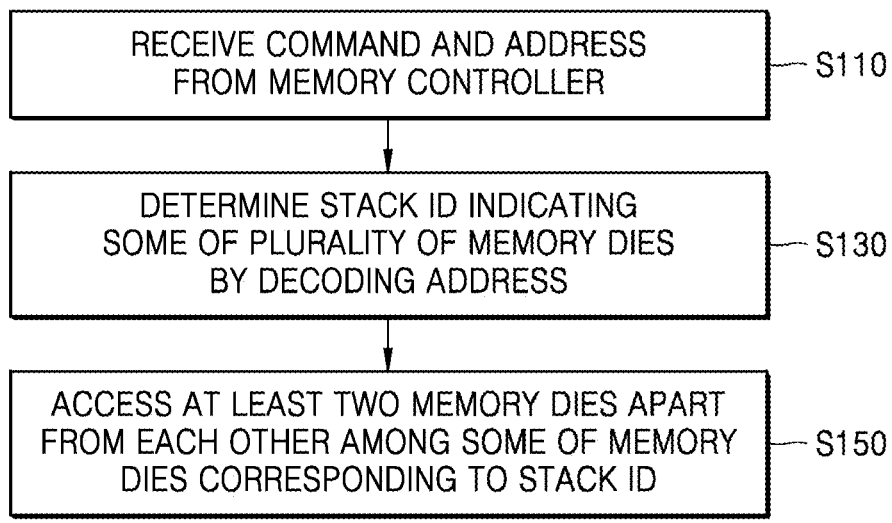
FIG. 12 is a view illustrating a method of operating a memory device according to an example embodiment.

FIG. 12 is a view illustrating a method of operating a memory device according to an example embodiment.

Referring to FIG. 12, the operating method according to the present example embodiment may include, for example, operations performed in a time series in the memory device 300 illustrated in FIGS. 3A and 3B. The descriptions given above with reference to FIGS. 3A and 3B may also be applied to the present example embodiment.

In operation S110, the memory device receives a command and an address from a memory controller. In operation S130, the memory device determines a stack ID indicating some of a plurality of memory dies by decoding the address. Two memory dies adjacent to each other among the plurality of memory dies may respectively correspond to different stack IDs.

In operation S150, the memory device accesses at least two memory dies apart from each other among some of the memory dies corresponding to the stack ID such that two adjacent memory dies of the plurality of memory dies are not accessed. In an example embodiment, the memory device may sequentially access at least two memory dies. However, the inventive concepts are not limited thereto, and in some example embodiments, the memory device may simultaneously access at least two memory dies.

In some example embodiments, the stack ID may correspond to a first stack ID (e.g., SID1 in FIG. 3A), and in operation S150, the memory device may access at least two memory dies including a memory die corresponding to a second stack ID (e.g., SID2 in FIG. 3A). For example, the memory device may access the first core die MD1 corresponding to the first stack ID SID1 and the fourth core die MD4 corresponding to the second stack ID SID2. At this time, the first and fourth core dies correspond to different first and second stack IDs SID1 and SID2, respectively, but are apart from each other, so that even if the first and fourth core dies MD1 and MD4 are accessed, hotspots may be reduced or prevented.

Further, in some example embodiments, the memory device may include a temperature sensor, and the operating method may further include dynamically adjusting memory dies corresponding to the stack ID based on a temperature sensed by the temperature sensor. For example, when a hotspot occurs in memory dies adjacent to a buffer die, for example, first and second core dies (e.g., MD1 and MD2 in FIG. 3A), memory dies corresponding to the stack ID may be dynamically adjusted to allow access to memory dies apart from the buffer die, for example, seventh and eighth core dies (e.g., MD7 and MD8 in FIG. 3A).

Figure 13:
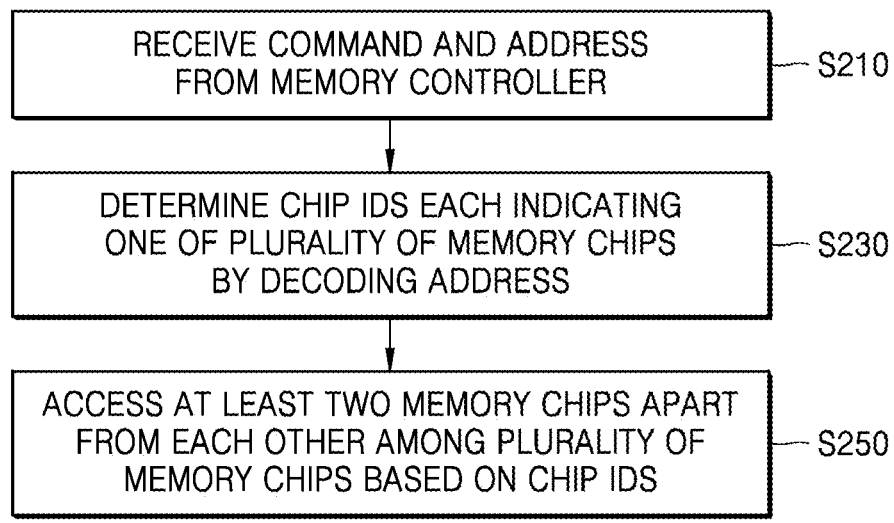
FIG. 13 is a view illustrating a method of operating a memory device, according to an example embodiment.

FIG. 13 is a view illustrating a method of operating a memory device according to an example embodiment.

Referring to FIG. 13, the operating method according to the present example embodiment may include, for example, operations performed in a time series in the memory devices 400 and 500 illustrated in FIGS. 7 and 9. The descriptions given above with reference to FIGS. 7 and 9 may also be applied to the present example embodiment.

In operation S210, the memory device receives a command and an address from a memory controller. In operation S230, the memory device determines chip IDs each or one or more chip ID indicating one of a plurality of memory chips by decoding the address. Two memory chips adjacent to each other among the plurality of memory chips may respectively correspond to different chip IDs. In an example embodiment, a plurality of memory chips may be connected to connecting pads on a printed circuit board by wire bonding. In an example embodiment, the plurality of memory chips may be connected to the printed circuit board via TSVs.

In operation S250, the memory device accesses at least two memory chips apart from each other among the plurality of memory chips based on the chip IDs. At this time, the memory device may sequentially access at least two memory chips.

In some example embodiments, operation S210 may include receiving a first command and a first address from the memory controller, and receiving a second command and a second address from the memory controller after the receiving of the first command and the first address. Operation S250 may include accessing a first memory chip among the plurality of memory chips based on a first chip ID included in the first address, and accessing a second memory chip that is not adjacent to the first memory chip among the plurality of memory chips based on a second chip ID included in the second address.

Furthermore, in some example embodiments, operation S250 may include accessing an $N^{th}$ memory chip, and the operating method may further include receiving an additional command and an additional address from the memory controller after operation S210, and accessing an $(N+1)^{th}$ memory chip apart from the $N^{th}$ memory chip among the plurality of memory chips based on a chip ID included in the additional address. In this way, each or one or more of chip IDs sequentially applied may indicate memory chips apart from each other.

Further, in some example embodiments, the memory device may include a temperature sensor, and the operating method may further include dynamically adjusting memory chips respectively corresponding to the chip IDs based on a temperature sensed by the temperature sensor. For example, when a hotspot occurs in memory chips adjacent to a printed circuit board, for example, first and second memory chips (e.g., MC1 and MC2 in FIG. 7), memory chips corresponding to the chip IDs may be dynamically adjusted to allow access to memory chips apart from the printed circuit board, for example, seventh and eighth memory chips (e.g., MC7 and MC8 in FIG. 7).

FIG. 14 is a block diagram showing a computing system 1000 according to an example embodiment.

Referring to FIG. 14, the computing system 1000 may include a central processing unit (CPU) 1100, an accelerator 1200, at least one memory device (1300, 1350, or 1600), at least one accelerator memory device (1400 or 1450), at least one cache memory or cache (1500, 1510, or 1520), and at least one storage 1700, which may communicate with each other via a system bus 1800. Also, the computing system 1000 may further include at least one memory controller (1310, 1410, or 1650) and at least one storage controller 1750. For example, the computing system 1000 may be a PC, a desktop, a laptop, a tablet, or a smartphone, but is not limited thereto.

The CPU 1100 may be connected to the cache 1500 or 1510. Code and data stored in the storage 1700 may be loaded into the memory device 1300, 1350, or 1600, and code and data frequently accessed by the CPU 1100 among the code and data loaded into the memory device 1300, 1350, or 1600 may be loaded into the cache 1500 or 1510. In an example embodiment, the CPU 1100 and the cache 1500 may be implemented as a single chip, and the cache 1500 may be referred to as an on-chip cache. In an example embodiment, the CPU 1100 may be connected to the cache 1510 through a bus, and the cache 1510 may be referred to as an off-chip cache.

The accelerator 1200 may be connected to the cache 1520, and the accelerator 1200 and the cache 1520 may be implemented as a single chip. However, the inventive concepts are not limited thereto, and the accelerator 1200 may be connected to an off-chip cache through a bus. The caches 1500, 1510, and 1520 may be implemented as a relatively fast volatile memory, for example, static random access memory (SRAM) or DRAM. However, the inventive concepts are not limited thereto, and the caches 1500, 1510, and 1520 may be implemented as a nonvolatile memory such as NAND flash, resistive RAM (ReRAM), PRAM, or MRAM.

The CPU 1100 may be directly connected to the system bus 1800 or may be connected to the system bus 1800 through a bridge 1320. Likewise, the accelerator 1200 may be directly connected to the system bus 1800 or may be connected to the system bus 1800 through a bridge 1420. The bridges 1320 and 1420 may be implemented as network devices, wireless network devices, switches, buses, clouds, or optical channels. In some example embodiments, the CPU 1100 and the accelerator 1200 may share the bridge 1320 or 1420.

The CPU 1100 may control the overall operation of the computing system 1000 and may include a single-core processor or a multi-core processor. For example, the CPU 1100 may include a general purpose processor, a digital signal processor (DSP), a microcontroller (MCU), a microprocessor, a network processor, an embedded processor, a field programmable gate array (FPGA), an application-specific instruction set processor (ASIP), an application-specific integrated circuit (ASIC) processor, and the like. For example, the CPU 1100 may be packaged as a common processor package, a multi-core processor package, a system-on-chip (SoC) package, a system-in-package (SiP) package, a system-on-package (SOP) package, and the like.

According to an example embodiment, the computing system 1000 may include at least one of the memory devices 1300, 1350, and 1600. The memory devices may be configured with a memory having a larger capacity and a longer latency than the caches 1500, 1510, and 1520, or a memory having a small capacity and a shorter latency than the storage 1700. For example, the memory devices 1300, 1350, and 1600 may be implemented as DRAM, resistance random access memory (RRAM), PRAM, MRAM, storage class memory (SCM), etc., but are not limited thereto. For example, the memory devices 1300, 1350, and 1600 may include DDR SDRAM, LPDDR SDRAM, GDDR SDRAM, RDRAM, or HBM.

The at least one memory device 1300 may be connected to the CPU 1100 through the memory controller 1310. In an example embodiment, the memory controller 1310 and the CPU 1100 may be implemented as a single chip. However, the present invention is not limited to this, and the memory controller 1310 and the CPU 1100 may be connected to each other through a bus. The at least one memory device 1350 may be connected to the CPU 1100 through a memory controller included in the bridge 1320. The at least one memory device 1600 may be connected to the CPU 1100 through the memory controller 1650 connected to the system bus 1800.

At least one of the memory devices 1300, 1350, and 1600 may be used as a main memory or a primary memory, and may be used as an execution space of software as an area directly accessible by the CPU 1100. In more detail, when software is executed, code and data are copied to at least one of the memory devices 1300, 1350, and 1600, and the CPU 1100 may execute software with the code and data copied to at least one of the memory devices 1300, 1350, and 1600. In addition, at least one of the memory devices 1300, 1350, and 1600 may maintain a database. For example, the database may include a dictionary, prior knowledge, and context data for natural language processing.

According to an example embodiment, the computing system 1000 may include at least one of the memory devices 1400 and 1450. For example, the accelerator memory devices 1400 and 1450 may be RAM, particularly NVRAM, or may be implemented as DRAM, PRAM, or SCM, but are not limited thereto. The accelerator memory devices 1400 and 1450 may communicate with the memory devices 1300, 1350, and 1600 and/or the storage 1700 through the CPU 1100 or the accelerator 1200, or may also communicate directly with the memory devices 1300, 1350, and 1600 and/or the storage 1700 by a DMA engine. In an example embodiment, the accelerator memory device 1400 or 1450 may reduce the burden of the accelerator 1200 and a bandwidth by directly performing some operations including a small-sized calculation device.

The at least one accelerator memory device 1400 may be connected to the accelerator 1200 through the accelerator memory controller 1410. In an example embodiment, the accelerator memory controller 1410 and the accelerator 1200 may be implemented as a single chip. However, the inventive concepts are not limited thereto, and the accelerator memory controller 1410 and the accelerator 1200 may be connected to each other through a bus. The at least one accelerator memory device 1450 may be connected to the accelerator 1200 through a memory controller included in the bridge 1420. Further, the computing system 1000 may further include an accelerator memory device connected to the accelerator 1200 through an accelerator memory controller connected to the system bus 1800.

The accelerator 1200 may be, for example, a GPU or NPU, another ASIC, or an application-specific processing device. The accelerator 1200 may be configured with a larger number of cores than the CPU 1100 and may operate at a clock frequency slower than the CPU 1100. The accelerator 1200 may interact with the accelerator memory device 1400 or 1450 to process an operation offloaded from the CPU 1100 or an operation specific to the application of the accelerator 1200. For example, when the accelerator 1200 sends a read request to the accelerator memory controller 1410 and the accelerator memory controller 1410 transfers a read command to the accelerator memory device 1400, the accelerator memory device 1400 may perform a read operation to transfer read data to the accelerator 1200 through the accelerator memory controller 1410. In addition, after the accelerator 1200 performs an operation using the data received from the accelerator memory controller 1410, the accelerator 1200 sends result data together with a write request to the accelerator memory controller 1410, and when the accelerator memory controller 1410 transfers a write command to the accelerator memory device 1400, the accelerator memory device 1400 may perform a write operation.

The accelerator memory devices 1400 and 1450 may store data and instructions related to the application of the accelerator 1200. Data and instructions specific to the application of the accelerator 1200 may be loaded from the storage 1700 or the memory devices 1300, 1350, and 1600 to the accelerator memory device 1400 or 1450. The accelerator memory devices 1400 and 1450 may have a larger bandwidth than the memory devices 1300, 1350, and 1600. Further, a first clock signal applied to the accelerator memory devices 1400 and 1450 and a second clock signal applied to the memory devices 1300, 1350, and 1600 may be clock signals separated from each other, and for example, a frequency of the first clock signal may be faster than a frequency of the second clock signal.

The accelerator memory devices 1400 and 1450 may use different interfaces from the memory devices 1300, 1350, and 1600, for example, a GDDR interface, an HBM interface, an HMC interface, and a wide I/O interface, which may be a JEDEC standard. A bus width of the accelerator memory devices 1400 and 1450 may be greater than a bus width of the memory devices 1300, 1350, and 1600, and for example, the accelerator memory devices 1400 and 1450 may be configured with a bus width of ×32 or more. In addition, in a case of the accelerator memory devices 1400 and 1450, the read data pin and the write data pin may be separated from each other, and the read strobe pin and the write strobe pin may be separated from each other. Furthermore, the number of strobe pins and the number of data pins of the accelerator memory devices 1400 and 1450 may be greater than the number of the memory devices 1300, 1350, and 1600.

For example, packets of the accelerator memory devices 1400 and 1450 may be composed of 32 to 128 bytes. For example, the accelerator memory device 1400 or 1450 may be implemented in a structure in which an upper die and a lower die are stacked, and the upper die and the lower die may be connected to a TSV and/or a microbump. For example, the lower die may include a memory controller. For example, the accelerator memory device 1400 or 1450 may be connected to the accelerator 1200 through 1024 or more links through a silicon interposer. Alternatively, the accelerator memory device 1400 or 1450 may be stacked on the accelerator 1200.

In an example embodiment, the accelerator 1200 will be referred to as a GPU that is a processing device specific to image processing, the at least one accelerator memory device 1400 or 1450 may be a GPU memory device, and the accelerator memory controller 1410 may be a GPU memory controller. In the following example embodiment, the accelerator 1200 will be referred to as a GPU 1200, the at least one accelerator memory device 1400 or 1450 will be referred to as at least one GPU memory device 1400 or 1450, and the accelerator memory controller 1410 will be referred to as a GPU memory controller 1410. The at least one GPU memory device 1400 or 1450 may obtain and maintain image data from the storage 1700 or the memory devices 1300, 1350, and 1600 at the request of the CPU 1100 or the GPU 1200. When the GPU 1200 sends a read request to the GPU memory controller 1410, the GPU memory controller 1410 may transfer a read command to the at least one GPU memory device 1400 or 1450, and the at least one GPU memory device 1400 or 1450 may transfer image data read by performing a read operation to the GPU 1200 through the GPU memory controller 1410. The GPU 1200 may perform parallel calculation of the received image data through a multi-core, and may transfer a calculation result to a frame buffer connected to the at least one GPU memory device 1400 or 1450 or the system bus 1800. However, the inventive concepts are not limited to the at least one GPU memory device 1400 or 1450, and the GPU 1200 may utilize at least one memory device 1300, 1350, or 1600.

In an example embodiment, the accelerator 1200 will be referred to as an NPU that is a processing device specific to a neural network operation, the at least one accelerator memory device 1400 or 1450 may be an NPU memory device, and the accelerator memory controller 1410 may be an NPU memory controller. In the following example embodiment, the accelerator 1200 will be referred to as an NPU 1200, the at least one accelerator memory device 1400 or 1450 will be referred to as at least one NPU memory device 1400 or 1450, and the accelerator memory controller 1410 will be referred to as an NPU memory controller 1410. The at least one NPU memory device 1400 or 1450 may maintain a model parameter specifying a neural network model, a training parameter for training weight data and a neural network model, a training data set, a test data set for evaluating training, a validation data set, a score, and an input data set for neural network inference and the resulting output data set. When training a neural network, the NPU 1200 may read the training data set, the model parameter, the weight data, etc. from the at least one NPU memory device 1400 or 1450, and may perform linear operations such as a multiply-accumulate operation (MAC) and a matrix operation, and nonlinear operations such as an activation function. For example, the activation function may be sigmoid, a hyperbolic tangent (tanh), a rectified linear unit (ReLU), leaky ReLU, Maxout, ELU, and the like. The NPU 1200 may update the weight data and the model parameter by comparing a result obtained by putting data corresponding to an input in the training data set into the model with data corresponding to an output in the training data set, and may write the updated weight data and model parameter to the at least one NPU memory device 1400 or 1450. Also, the NPU 1200 may read the test data set or the validation data set from the at least one NPU memory device 1400 or 1450 during training, may evaluate the neural network model by comparing a result obtained by performing a neural network model operation on data corresponding to the input with data corresponding to the output, and may write the result in the at least one NPU memory device 1400 or 1450 in the form of a score or the like. The NPU 1200 may repeat updating of the weight data and the model parameter until the score converges within a certain level. However, the inventive concepts are not limited to the at least one NPU memory device 1400 or 1450, and the NPU 1200 may utilize the at least one memory device 1300, 1350, or 1600.

The storage controller 1750 may control the overall operation of the storage 1700. The storage controller 1750 may write data to the storage 1700 in response to a write request, or may read data from the storage 1700 in response to the read request. For example, the storage 1700 may include a NAND flash including a plurality of NAND flash memory cells. However, the inventive concepts are not limited thereto, and the storage 1700 may include nonvolatile memory other than the NAND flash, for example, ReRAM, PRAM, or MRAM, or may include a magnetic storage medium, an optical storage medium, and the like.

The configuration of the storage 1700 is not limited to the above, and may be configured with various memories such as DRAM, SDRAM, a hard disk drive (HDD), a solid-state drive (SSD), a redundant array of independent disks (RAID) volume, a nonvolatile dual in-line memory module (NVDIMM), a network attached storage (NAS), a flash memory such as a flat or three-dimensional NAND flash or a Noah flash, a three-dimensional cross-point memory, nonvolatile MRAM (NVMRAM), FRAM, ReRAM Memristor, and a combination thereof.

In addition, the computing system 1000 may further include an expansion bus interface 1850 that mediates the system bus 1800 and an expansion bus 1900, and the system bus 1800 and the expansion bus 1900 may be connected to each other through the expansion bus interface 1850. The computing system 1000 may further include an input/output device 1910 connected to the expansion bus 1900, a modem 1920, a network device 1930, a storage controller 1940, and a storage 1950. The storage controller 1940 and the storage 1950 may be implemented substantially similar to the storage controller 1750 and the storage 1700.

While some example embodiments of the inventive concepts have been particularly shown and described, it will be understood that various changes in form and details may be made therein without departing from the spirit and scope of the following claims.

What is claimed is:

1. A method of operating a stacked memory device including a plurality of memory dies stacked in a vertical direction, the method comprising:

receiving a command and an address from a memory controller;
determining a stack ID indicating a subset of the plurality of memory dies by decoding the address; and
accessing at least two memory dies among the subset of memory dies corresponding to the stack ID such that the at least two memory dies are non-adjacent,
wherein the accessing of the at least two memory dies comprises sequentially accessing the at least two memory dies.

2. The method of claim 1, wherein the plurality of memory dies comprise a first memory die, a second memory die, a third memory die, and a fourth memory die sequentially stacked on a buffer die, and
the stack ID is a first stack ID corresponding to the first and third memory dies or a second stack ID corresponding to the second and fourth memory dies.

3. The method of claim 1, wherein the plurality of memory dies comprise a first memory die, a second memory die, a third memory die, a fourth memory die, a fifth memory die, a sixth memory die, a seventh memory die, and an eighth memory die sequentially stacked on a buffer die, and
the stack ID is a first stack ID corresponding to the first, third, fifth, and seventh memory dies or a second stack ID corresponding to the second, fourth, sixth, and eighth memory dies.

4. The method of claim 1, wherein the stack ID corresponds to one of at least three stack IDs each indicating at least one memory die.

5. The method of claim 4, wherein the plurality of memory dies comprise a first memory die, a second memory die, a third memory die, a fourth memory die, a fifth memory die, and a sixth memory die sequentially stacked on a buffer die, and
the stack ID is a first stack ID corresponding to the first and fourth memory dies, a second stack ID corresponding to the second and fifth memory dies, or a third stack ID corresponding to the third and sixth memory dies.

6. The method of claim 1, wherein the plurality of memory dies comprise a first memory die, a second memory die, a third memory die, a fourth memory die, a fifth memory die, a sixth memory die, a seventh memory die, and an eighth memory die sequentially stacked on a buffer die, and
the stack ID is a first stack ID corresponding to the first, second, fifth, and sixth memory dies or a second stack ID corresponding to the third, fourth, seventh, and eighth memory dies.

7. The method of claim 1, wherein the stacked memory device further comprises a buffer die in communication with the memory controller,
the stack ID is a first stack ID indicating a first subset of the plurality of memory dies or a second stack ID indicating a second subset of the plurality of memory dies,
the plurality of memory dies respectively correspond to a plurality of core dies stacked on the buffer die,
the buffer die is connected to the first subset of the plurality of memory dies through first TSVs, and
the buffer die is connected to the second subset of the plurality of memory dies through second TSVs.

8. The method of claim 7, wherein each of the plurality of core dies comprises a plurality of memory cells, and
the buffer die does not include a memory cell.

9. The method of claim 7, wherein a size of the buffer die in a horizontal direction is greater than a size of each of the plurality of core dies in a horizontal direction.

10. The method of claim 1, wherein each of the plurality of memory dies comprises a calculation circuit, and
the method further comprises:
receiving data from the memory controller; and
performing calculation processing by the calculation circuit of a memory die corresponding to the address using the data received from the memory controller.

11. The method of claim 1, wherein the stacked memory device further comprises a buffer die including a calculation circuit, and
the method further comprises:
receiving data from the memory controller; and
performing calculation processing by the calculation circuit using the data received from the memory controller.

12. The method of claim 1, further comprising dynamically adjusting memory dies corresponding to the stack ID based on a temperature of the stacked memory device.

13. The method of claim 1, wherein the stack ID corresponds to a first stack ID, and
the accessing the at least two memory dies comprises accessing a memory die corresponding to a second stack ID different from the first stack ID.

14. The method of claim 1, wherein the stacked memory device includes a high bandwidth memory (HBM).

15. A method of operating a stacked memory device including a plurality of memory chips stacked in a vertical direction, the method comprising:
receiving a command and an address from a memory controller;
determining chip IDs each indicating one memory chip among the plurality of memory chips by decoding the address; and
sequentially accessing at least two memory chips among the plurality of memory chips based on the chip IDs such that the at least two memory chips are non-adjacent,
wherein
the receiving the command and the address comprises:
receiving a first command and a first address from the memory controller; and
receiving a second command and a second address from the memory controller after the receiving the first command and the first address.

16. The method of claim 15, wherein
the sequentially accessing the at least two memory chips comprises:
accessing a first memory chip among the plurality of memory chips based on a first chip ID included in the first address; and
accessing a second memory chip not adjacent to the first memory chip among the plurality of memory chips based on a second chip ID included in the second address after the accessing the first memory chip.

17. The method of claim 15, wherein the accessing the at least two memory chips comprises accessing an $N^{th}$ memory chip, and
the method further comprises:
receiving an additional command and an additional address from the memory controller after the receiving the command and the address; and
accessing an $(N+1)^{th}$ memory chip among the plurality of memory chips based on a chip ID included in the additional address such that the $N^{th}$ memory chip and the $(N+1)^{th}$ memory chip are non-adjacent.

18. The method of claim 15, wherein a memory chip corresponding to an $(N+1)^{th}$ chip ID among the plurality of memory chips is arranged above memory chips corresponding to an $N^{th}$ chip ID and an $(N+2)^{th}$ chip ID, respectively.

19. A stacked memory device comprising a plurality of memory dies stacked in a vertical direction,
   wherein the plurality of memory dies comprise:
      a first memory die;
      a third memory die electrically connected to the first memory die through first TSVs; and
      a second memory die between the first memory die and the third memory die,
      wherein the second memory die is not connected to the first TSVs.

* * * * *